United States Patent [19]
Kudo et al.

[11] Patent Number: 5,317,778
[45] Date of Patent: Jun. 7, 1994

[54] AUTOMATIC CLEANING APPARATUS FOR WAFERS

[75] Inventors: Hideo Kudo; Isao Uchiyama, both of Fukushima; Yoshiharu Kimura, Niigata; Morie Suzuki, Fukushima; Takashi Tanakajima, Gunma, all of Japan

[73] Assignee: Shin-Etsu Handotai Co., Ltd., Japan

[21] Appl. No.: 920,392

[22] Filed: Jul. 27, 1992

[30] Foreign Application Priority Data

| Jul. 31, 1991 | [JP] | Japan | 3-214654 |
| Jul. 31, 1991 | [JP] | Japan | 3-214655 |
| Aug. 13, 1991 | [JP] | Japan | 3-226358 |
| Aug. 13, 1991 | [JP] | Japan | 3-226359 |
| Aug. 13, 1991 | [JP] | Japan | 3-226360 |

[51] Int. Cl.$^5$ .................. B08B 11/02; A46B 13/04
[52] U.S. Cl. ........................ 15/88.3; 15/77; 15/97.1
[58] Field of Search .......... 15/77, 88.2, 88.3, 102, 15/97.1

[56] References Cited

U.S. PATENT DOCUMENTS

| 4,569,695 | 2/1986 | Yamashita et al. | 15/77 |
| 5,081,733 | 1/1992 | Kudo | 15/77 |
| 5,092,011 | 3/1992 | Gommori et al. | 15/88.2 |

*Primary Examiner*—Edward L. Roberts
*Attorney, Agent, or Firm*—Whitham & Marhoefer

[57] ABSTRACT

An automatic cleaning apparatus cleans wafers one at a time without the necessity for transporting the wafers in a carrier such as a wafer cassette or basket. After a manufacturing step such as a polishing step, the wafers are carried to a loader assembly in a horizontal orientation under the influence of flowing liquid. The wafers are then individually erected into a vertical orientation by being first stopped by stopper pins which stand vertically on a wafer receiving plate of a suction arm including a suction nozzle which firmly holds the wafers while the arm is pivotally rotated until the wafer is positioned into a vertical orientation. The vertical orientation thus achieved allows the wafer to be gripped by a wafer gripping portion of a transportation robot including grooved gripping arms operated by a mechanism which limits the force applied to the wafer. Cleaning baths include an arrangement for supporting wafers in a near vertical orientation and nozzles which direct cleaning liquids in a direction tending to prevent floating of the wafers. A brush cleaning bath provides for simultaneous cleaning of both sides of the wafer with rotatory brushes, during which the wafer is supported vertically and made to move circumferentially by rollers while periodic vertical motion between the wafer-supporting rollers and the brushes is achieved with a drive motor and ball screw. A drying bath using infrared light completes the cleaning procedure before the wafers are loaded into an unloader assembly into which wafer cassettes are set.

21 Claims, 20 Drawing Sheets

AUTOMATIC CLEANING APPARATUS FOR WAFERS

BACKGROUND OF THE INVENTION

1. Field of the Invention

The present invention relates to an apparatus for automatically cleaning semiconductor wafers in a one-by-one manner (single wafer transfer system), including a wafer erection assembly, a brush cleaning bath, a plurality of wafer cleaning baths adapted to clean one wafer at a time by having each wafer steeped (e.g. soaked thoroughly) in a generally vertical orientation in the cleaning liquid, and a wafer handling apparatus consisting of a robot arm.

2. Description of the Prior Art

In the semiconductor device manufacturing technology, the impurities adhering to the surfaces of the semiconductor wafers are known to adversely affect the properties of the resulting semiconductor devices.

Therefore, a cleaning step is included in the semiconductor wafer manufacturing process. In the cleaning step, the wafers are cleaned in various methods which are classified broadly into two groups: mechanical cleaning methods and chemical cleaning methods.

The mechanical cleaning methods include the brushing method wherein the impurities adhering to the wafer surfaces are directly brushed off by means of appropriate brushes, the flushing method wherein the impurities are removed from the wafer surfaces as pressurized fluid from an injection nozzle is applied to the wafer locally or entirely, the ultrasonic cleaning method wherein the wafers are submerged in a liquid and the impurities are vibrated to detach from the wafer surfaces as ultrasonic waves are applied to the wafers.

The chemical cleaning methods include the methods wherein the impurities adhering to the surfaces of the wafers are removed as they are chemically dissolved by various chemicals and enzymes. There are other cases wherein a chemical cleaning method is combined with a mechanical cleaning method.

PROBLEMS THE INVENTION SEEKS TO SOLVE

In the field of semiconductor manufacturing, the recent tendency of ever increasing density in semiconductor device has favored enlargement of the semiconductor wafer diameter. As the result, the conventionally adopted method of cleaning a plurality of wafers at a time while they are contained in a wafer carrier imposes heavy labor on the human attendants.

Also, if the wafers are carried in the carrier, the wafers are contaminated with particles and the like which they receive from the carrier due to contact of the wafers with the carrier.

Furthermore, if the wafers, after polishing, are temporarily stocked to wait until the next cleaning stage is ready to receive them, the surfaces of the wafers are dried and the impurities may remain or be real adhering to the wafer surfaces.

The present invention was contrived in view of the above problems, and it is, therefore, an object of the invention to provide an automatic wafer cleaning apparatus which is capable of automatically cleaning the wafers one by one after they are finished with the polishing treatment, so that it would become possible to do away with the conventional carriers (realization of carrier-less operation), reduce the necessity of human labor involvement, and improve the product quality.

To make the most of such an automatic wafer cleaning apparatus, it is desirable that the wafers, after being polished, are transported to the automatic wafer cleaning apparatus through a fluid, (e.g., pure water,) by means of the fluid stream so that the wafer is not allowed to dry during the transportation. To convey the wafers by fluid stream, the wafers must be oriented horizontally in the stream. Therefore, if the automatic cleaning apparatus is designed such that the wafers are held vertically by the wafer handling apparatus such as a transportation robot as they are transported one by one, then the wafers which are brought in by the fluid stream, maintaining the horizontal orientation, must first be erected to a vertical orientation before each of them can be held vertically by the robot arm.

Therefore, it is also an object of the invention to provide a method and an apparatus for erecting a wafer vertically after it has been brought to the cleaning apparatus in a horizontal posture, so as to enable the wafer to be readily held vertically by the robot arm.

The surface of a wafer which has been polished is stuck to by particles, and to remove the particles by brush cleaning, it is necessary for an automatic cleaning apparatus of single wafer transfer system to have the wafer stand vertically when it is brushed.

Therefore, it is also an object of the invention to provide the automatic single wafer transfer type cleaning apparatus with a brush cleaning assembly which is capable of brushing both faces of a vertically held wafer at once and at a high efficiency.

Furthermore, in the automatic single wafer transfer type cleaning apparatus, since the wafer is generally held vertically as it is transferred it is necessary that the wafer is held vertically and stably when it is steeped in the cleaning liquid of each cleaning bath.

Therefore, it is a further object of the invention to provide wafer cleaning baths which are capable of allowing each wafer to be steeped vertically and held stably in the cleaning liquid for cleaning operation.

The present invention further provides the cleaning apparatus with a transportation robot as a wafer handling apparatus which can hold the wafers vertically and transport them one by one to thereby attain the automatic single wafer transfer type cleaning operation.

SUMMARY OF THE INVENTION

Means to Solve the Problems

In order to attain the object of the invention, there is provided an automatic wafer cleaning apparatus, the present invention provides an automatic wafer cleaning apparatus of single wafer transfer type comprising: a loader assembly for receiving, in a liquid, the wafers to be cleaned one wafer at a time, each wafer assuming the horizontal position as each wafer is brought to the loader assembly carried by a liquid stream, and for erecting each wafer vertically; a brush cleaning bath for holding a wafer between a pair of cylindrical rotatory brushes to thereby clean both faces of the wafer at once; a plurality of wafer cleaning baths containing respective cleaning liquids for receiving and cleaning the vertically steeped wafers one at a time; a dryer bath for drying cleaned wafers; an unloader assembly for storing the dried wafers in it; and a transportation means for vertically holding and transporting the wafers one at a time.

In a preferred embodiment, the loader assembly includes a wafer erection assembly for receiving a wafer carried horizontally thereto and for erecting the wafer vertically, the wafer erection assembly comprising a suction arm having a wafer sucking means and a wafer positioning means, and a drive means for swinging the suction arm about a horizontal shaft.

In another preferred embodiment, the wafer positioning means comprises a wafer receiving plate and stopper pins provided to stand vertically on the wafer receiving plate in an arcuate row such that these pins circumscribe a circle having a diameter equivalent to that of the wafer.

Furthermore, the invention proposes a method for erecting a wafer comprising the steps of: (a) stopping the wafer which is borne horizontally by a liquid stream by means of stopper pins provided to stand perpendicularly on a wafer receiving plate in an arcuate row such that these pins circumscribe a circle having a diameter equivalent to that of the wafer, (b) positioning the wafer by means of the stopper pins and the flow of the liquid in a manner such that the wafer is circumscribed by the pins, (c) sucking and thus fixing the wafer horizontally on the brim of a suction nozzle provided at the end of a suction arm adapted to swing about a horizontal shaft, the nozzle being connected to a vacuum source via a vacuum suction conduit, then (d) turning the suction arm through an upward angle of 90° about the horizontal shaft.

According to a still more preferred embodiment of the automatic wafer cleaning apparatus, the brush cleaning bath includes a brush cleaning assembly for holding a wafer vertically between brushes and brushing both faces of the vertically held wafer at once, the brush cleaning assembly having a pair of horizontal and parallel cylindrical rotatory brushes, a brush drive means for driving the rotatory brushes to rotate, and a wafer drive means for supporting and driving the wafer to turn circumferentially.

Furthermore, it is preferable that the wafer cleaning baths each comprise a vertical thin tank for containing a cleaning liquid, a wafer holder means for supporting the wafer nearly vertically in the vertical thin tank, and injection nozzles for injecting the cleaning liquid toward the upper part of the wafer supported by the wafer holder means.

According to an aspect of the preferred embodiment of the invention, the wafer holder means is detachably hooked in the tank, and has a pair of rollers at the lower part thereof which rollers are pivoted on the respective axes so as to freely rotate on them, the peripheries of the rollers being V-letter shaped in profile so as to provide seats for wafer edges for supporting the wafer in a manner such that the wafer leans on the tank wall and is slightly tilted from the vertical position.

Furthermore, it is preferable if the dryer bath includes medium-wave radiators each having a medium-wave infrared ray lamp and short-wave radiators each having a short-wave infrared ray lamp.

According to a best mode embodiment, the transportation means includes a wafer handling assembly and the wafer handling assembly comprises: a horizontal duplex tubular complex comprising an internal hollow shaft and an external hollow shaft which latter is supported in a manner such that it can freely shift axially, while the internal shaft is freely slidable in the external hollow shaft; a pair of vertical hold-between arms for holding a wafer therebetween, one arm being connected to the external shaft near one end external shaft and the other arm being connected to the internal shaft at that end of the internal shaft which is on the same side as the one end of the external shaft; an actuator subassembly which is functionally connected to the other ends of the external shaft and internal shaft, and is adapted to drive these shafts in a manner such that these shafts are simultaneously shifted in the opposite axial directions by the same amount.

Effects

According to the invention, the invented automatic wafer cleaning apparatus is designed as a single wafer transfer type apparatus so that the wafers are supported and transferred by the transportation means one by one, and as such it is possible to conduct a continuous cleaning operation (that is, the wafers are not stocked temporarily); as a consequence, the conventional batch-type wafer carriers are not required by the present apparatus (realization of the carrier-less operation), so that a major contamination problem of the wafer is solved and the wafer quality is improved. Furthermore, even if the wafers are comparatively heavy due to their large sizes, as recently favor each wafer is carried automatically by the transportation means so that the operator need not carry the wafers, thus it has become possible to save human labor.

Since each wafer which arrives in the loader assembly by assuming a horizontal position, is picked up by the wafer erection assembly, it is now possible for the wafer transportation means to hold the wafer vertically without swinging of the robot arm.

Furthermore, according to the invention, it has become possible to brush a wafer while keeping the wafer vertically by virtue of the rotatory brushes, and it is also possible to brush both faces of the wafer at once.

Also, according to the invention, the actuator causes the internal and external shafts of the robot arm to move in opposite directions simultaneously, whereby the vertical hold-between arms either decrease or increase their distance so that a wafer can be held vertically between them or released from them, and thus the wafer can be transported while in a vertical orientation, and steeped (e.g. immer vertically into each bath; thus, the wafers can be cleaned automatically one by one in each bath. Each bath is so equipped that the cleaning liquid is shot from the nozzles onto the upper part of the wafer which leans on the wall opposite to the nozzles so that the wafer is pressed downward and would not float in the bath.

These and other objects and many of the attendant advantages of this invention will be readily appreciated as the same becomes better understood by reference to the following detailed description when considered in connection with the accompanying drawing.

EMBODIMENT

Next, an embodiment of the invention will be described with reference to the attached drawings.

Figure 1:
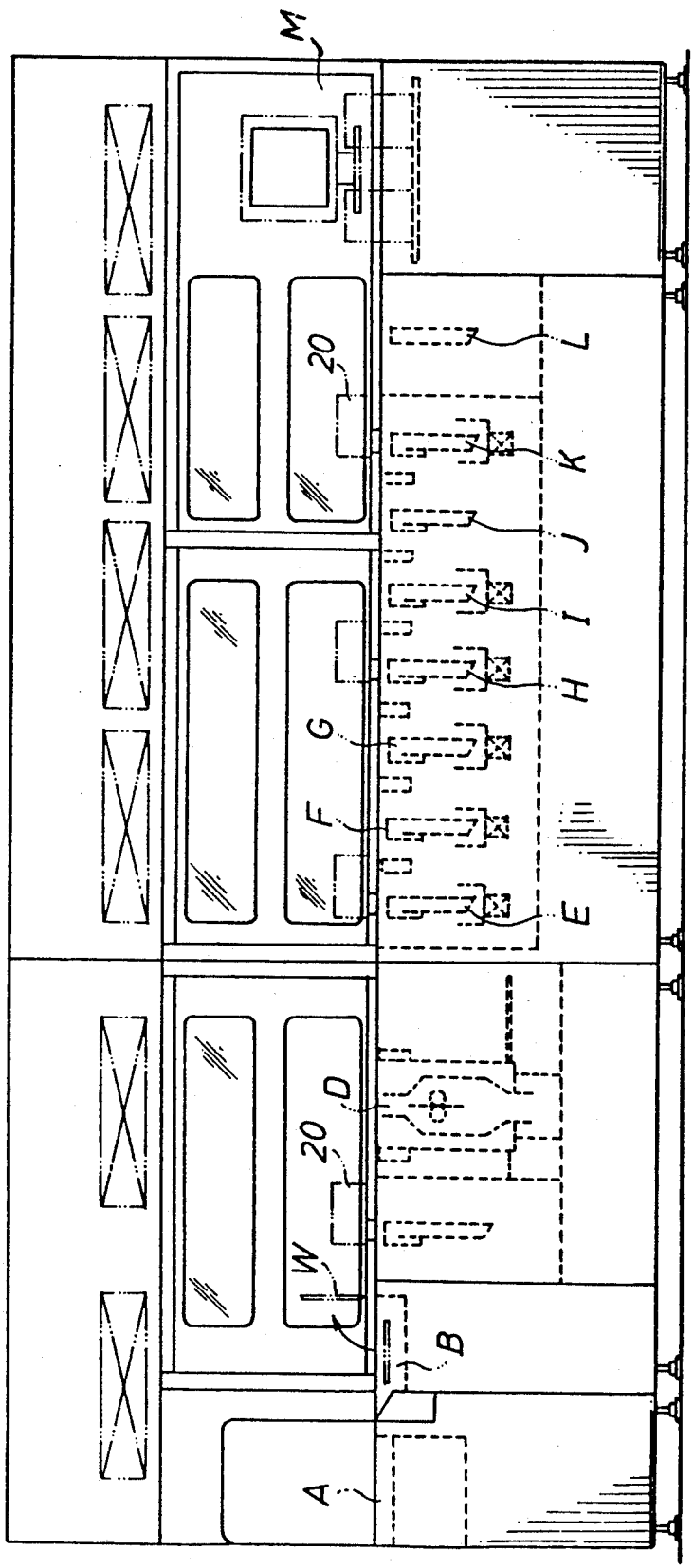
FIG. 1 is a front view of the automatic wafer cleaning apparatus according to the invention.
Figure 2:
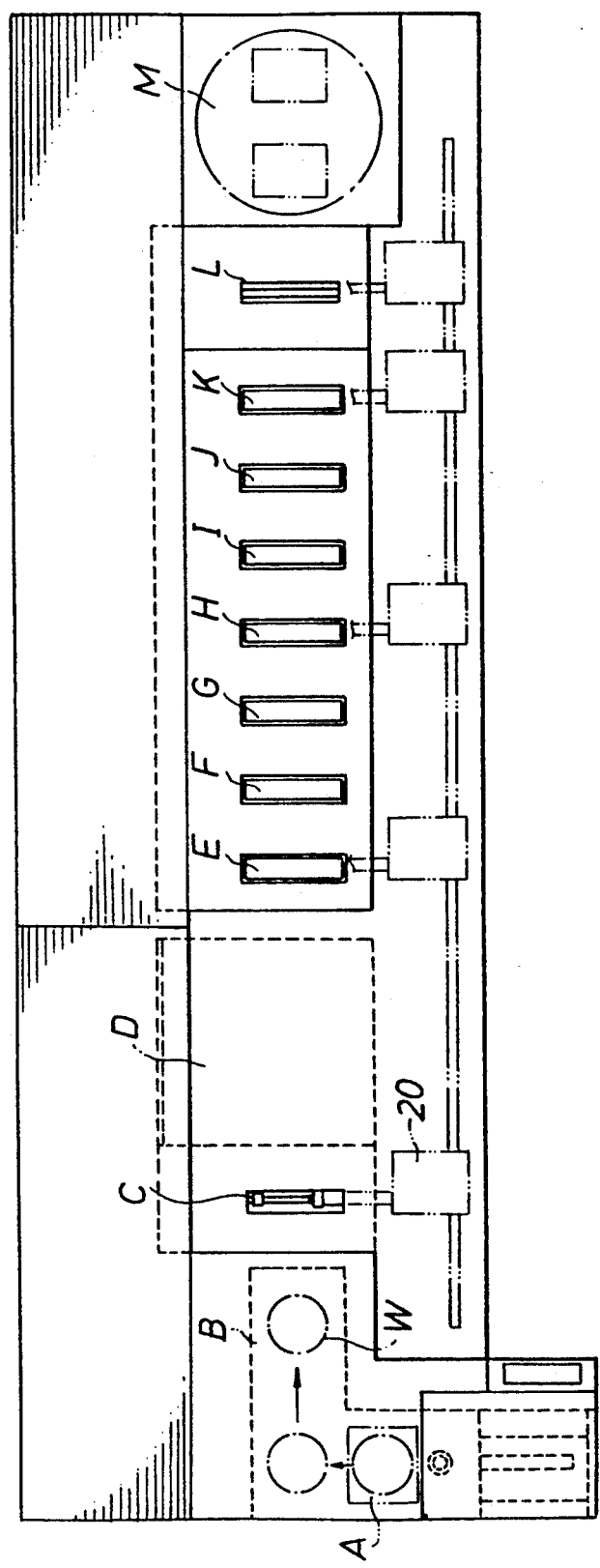
FIG. 2 is a top plan view of the automatic wafer cleaning apparatus according to the invention.
Figure 3:
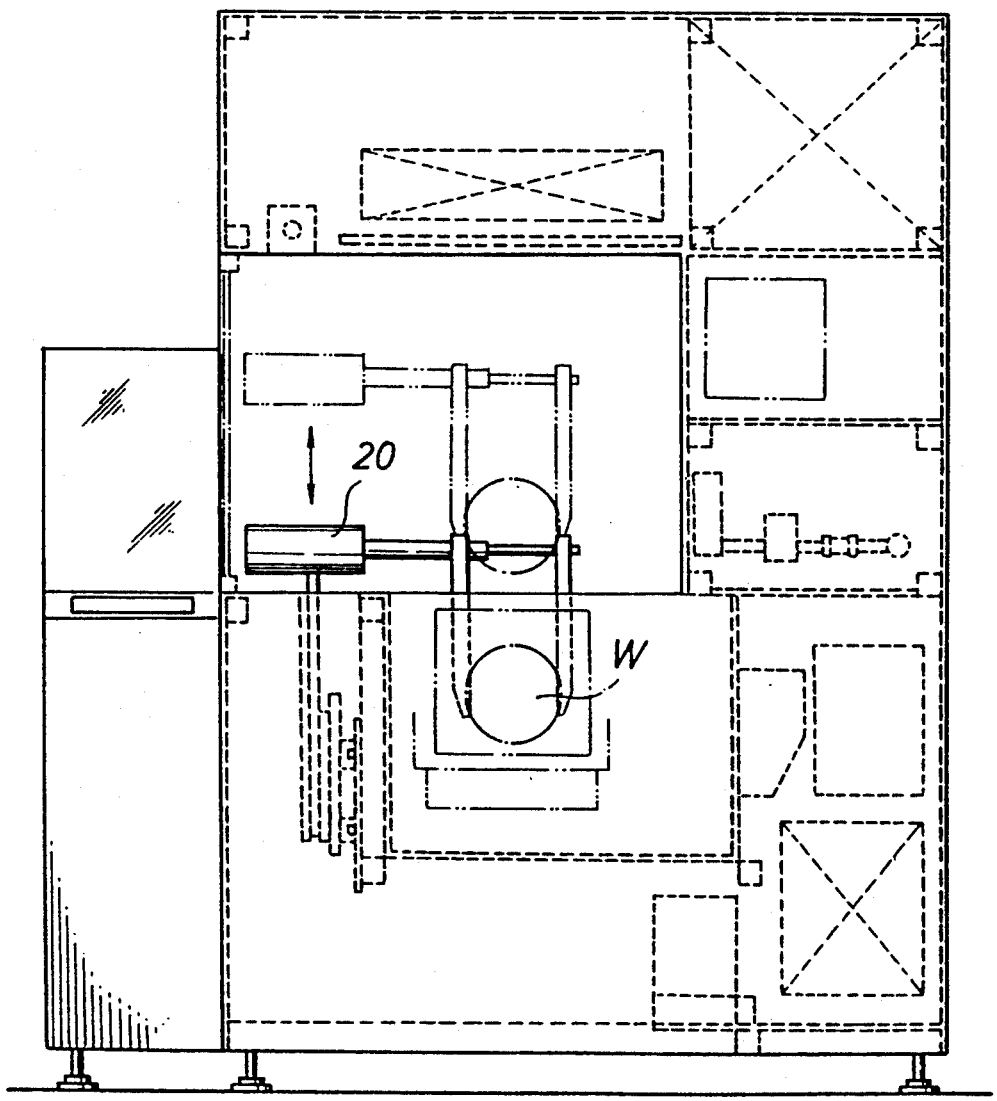
FIG. 3 is a side view of the automatic wafer cleaning apparatus according to the invention.
Figure 4:
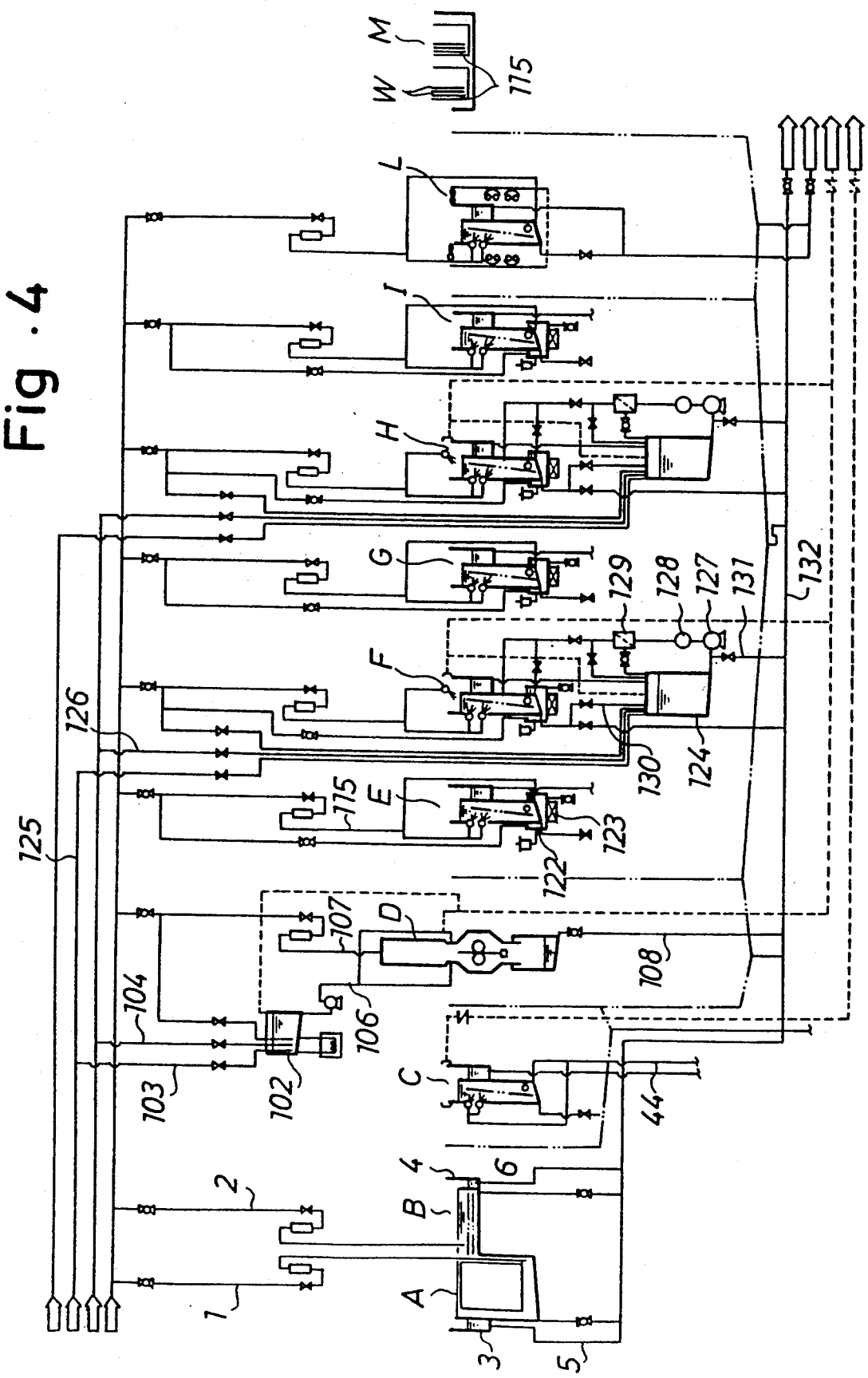
FIG. 4 is a flow sheet showing the arrangement of the automatic wafer cleaning apparatus according to the invention.

FIGS. 1, 2, and 3 are respectively a front view, a top plan view, and a side view of the automatic wafer cleaning apparatus according to the invention; FIG. 4 is a flow sheet, and this automatic wafer cleaning apparatus has a loader assembly A, a wafer reception bath B, a preliminary cleaning bath C, a brush cleaning bath D, five cleaning baths E, F, G, H, I, two preliminary baths J, K, a dryer bath L, and an unloader assembly M.

As shown in FIG. 4, the loader assembly A and the wafer reception bath B are filled with highly pure water, which is supplied to them respectively via a conduit 1 and a conduit 2. Incidentally, the pure water which overflows from respective overflow tanks 3, 4 of the loader assembly A and the wafer reception bath B flows through respective conduits 5, 6 and then through a drain conduit 132 to be drained eventually, so that the levels of the pure water in the loader assembly A and the wafer reception bath B are maintained constant.

The wafers which have had one of the faces polished to mirror finish in the preceeding polishing stage are automatically transported one by one to the loader assembly A, and then into the wafer reception bath B borne by the flow of the pure water.

Figure 5:
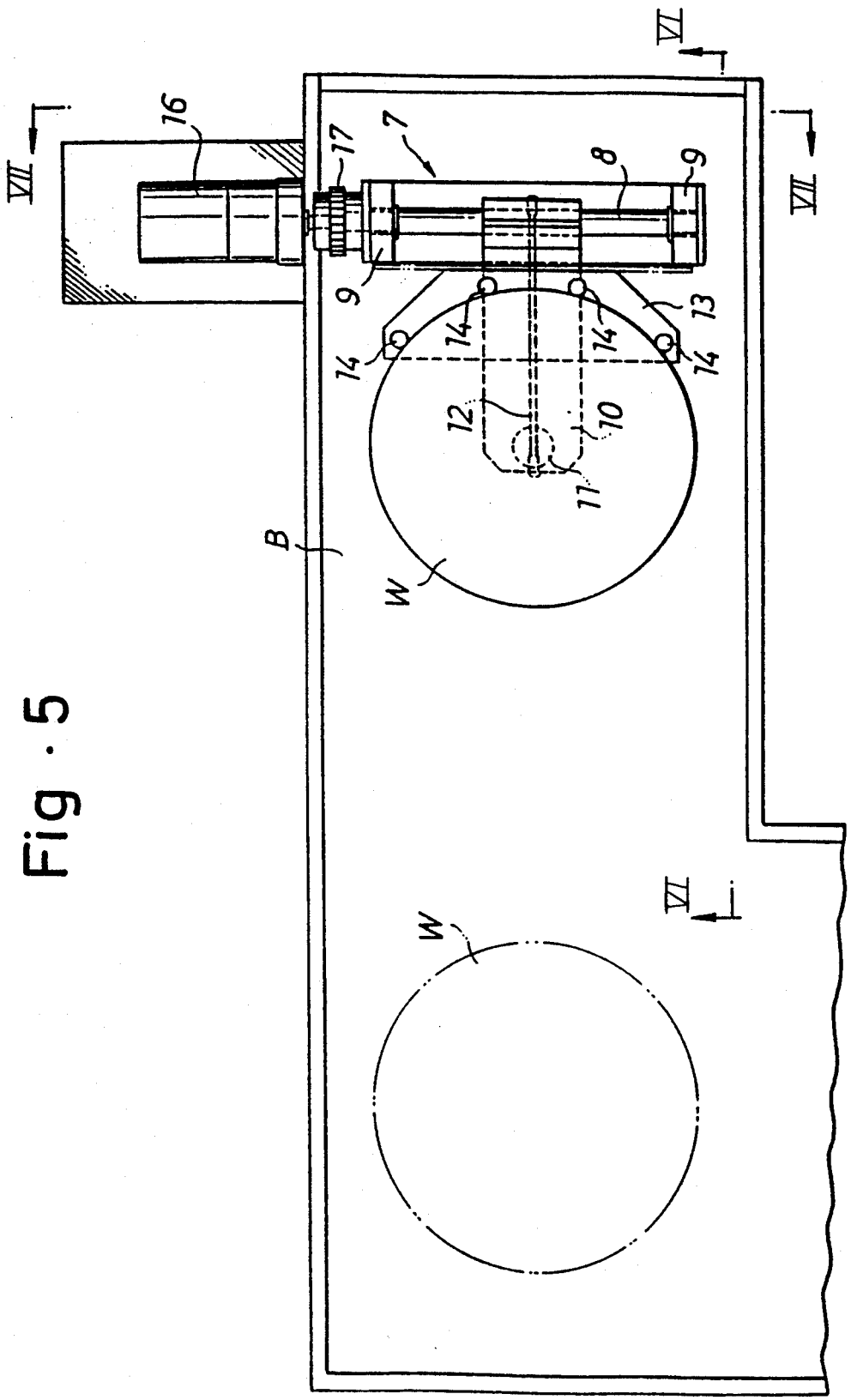
FIG. 5 is a top plan view of the wafer erection assembly.
Figure 6:
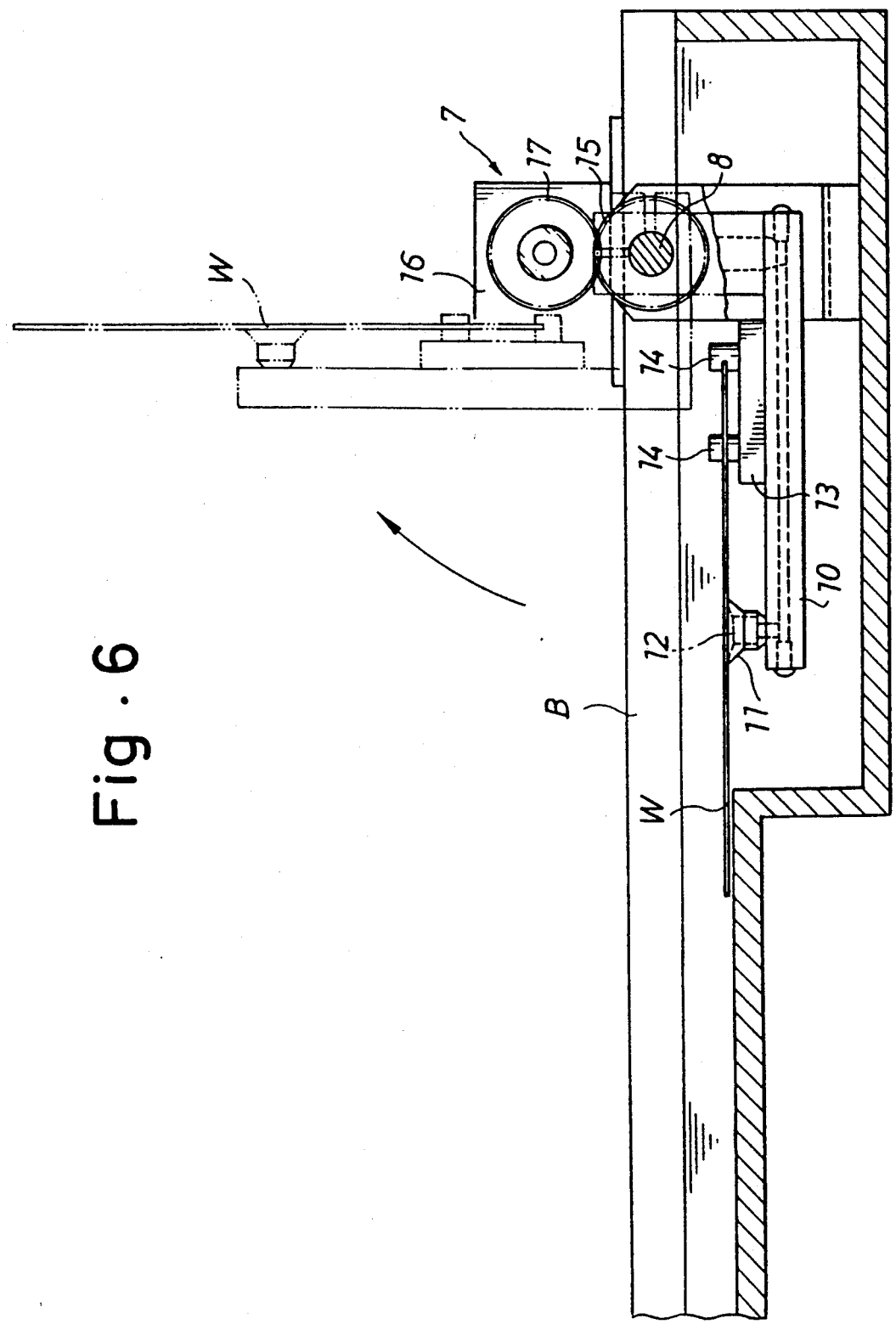
FIG. 6 is a cross section taken on line VI—VI of FIG. 5.
Figure 7:
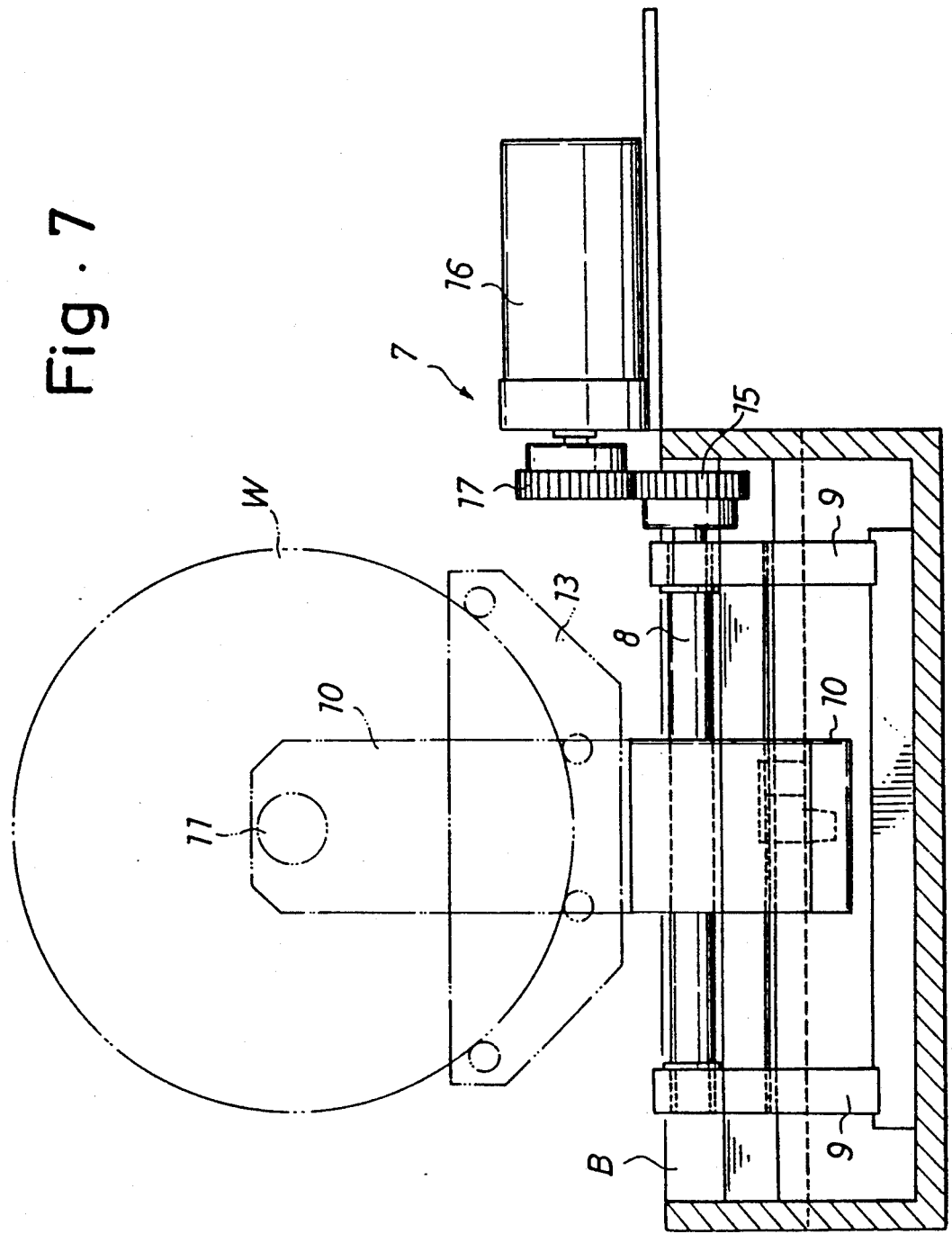
FIG. 7 is a cross section taken on line VII—VII of FIG. 5.

In the wafer reception bath B is installed a wafer erection assembly 7, as shown in FIGS. 5 through 7. Incidentally, FIG. 5 is a top plan view of the wafer erection assembly 7, and FIG. 6 and FIG. 7 are cross sections taken on lines VI—VI and VII—VII of FIG. 5, respectively.

As shown by the drawings, in the wafer reception bath B a rotatory shaft 8 is borne at its ends by a pair of bearing units 9, 9 in a manner such that it is freely rotatory, and a suction arm 10 is rigidly and perpendicularly connected at its one end to the middle portion of the rotatory shaft 8. A suction nozzle 11 is provided at the fore end of the suction arm 10, and a vacuum suction conduit 12 opens into this suction nozzle 11. Also, this vacuum suction conduit 12 is connected to a vacuum source such as a suction pump, not shown, by means of a conduit.

Also, a wafer receiving plate 13 is adhered to the suction arm 10, and four stopper pins 14 are provided to stand firmly and vertically on the wafer receiving plate 13 in an arcuate row such that these pins 14 circumscribe a circle having a diameter equivalent to that of the wafer W and having the center exactly above the center of the nozzle 11.

As shown in FIG. 7, a gear 15 is locked about one end of the rotatory shaft 8, and this gear 15 is meshed with a gear 17, which is locked about the end of the output shaft of a servomotor 16.

A wafer W flown borne into the wafer reception bath B is stopped by the four stopper pins 14 of the wafer receiving plate 13, and thus forced to assume a position such that the center of the wafer W coincides with the center of the nozzle 11 of the suction arm 10, which has been turned to pose horizontally and submerged in the pure water to wait for the wafer, as shown by solid line in FIG. 6. Thereafter, as the vacuum source, not shown, is operated, suction is applied to the wafer W which is thus held firmly by the vacuum nozzle 11 by virtue of the negative pressure working at the nozzle 11. Next, as the servomotor 16 is operated, the rotational torque thereof is transmitted to the rotatory shaft 8 via the gears 17 and 15, and the rotatory shaft 8 and the suction arm 10 together with the wafer W are turned through an angle of 90° in the direction shown by the curved arrow (clockwise as seen in FIG. 6), whereby the wafer W is erected vertically, as shown by two-dot chain line in FIG. 6.

Figure 8:
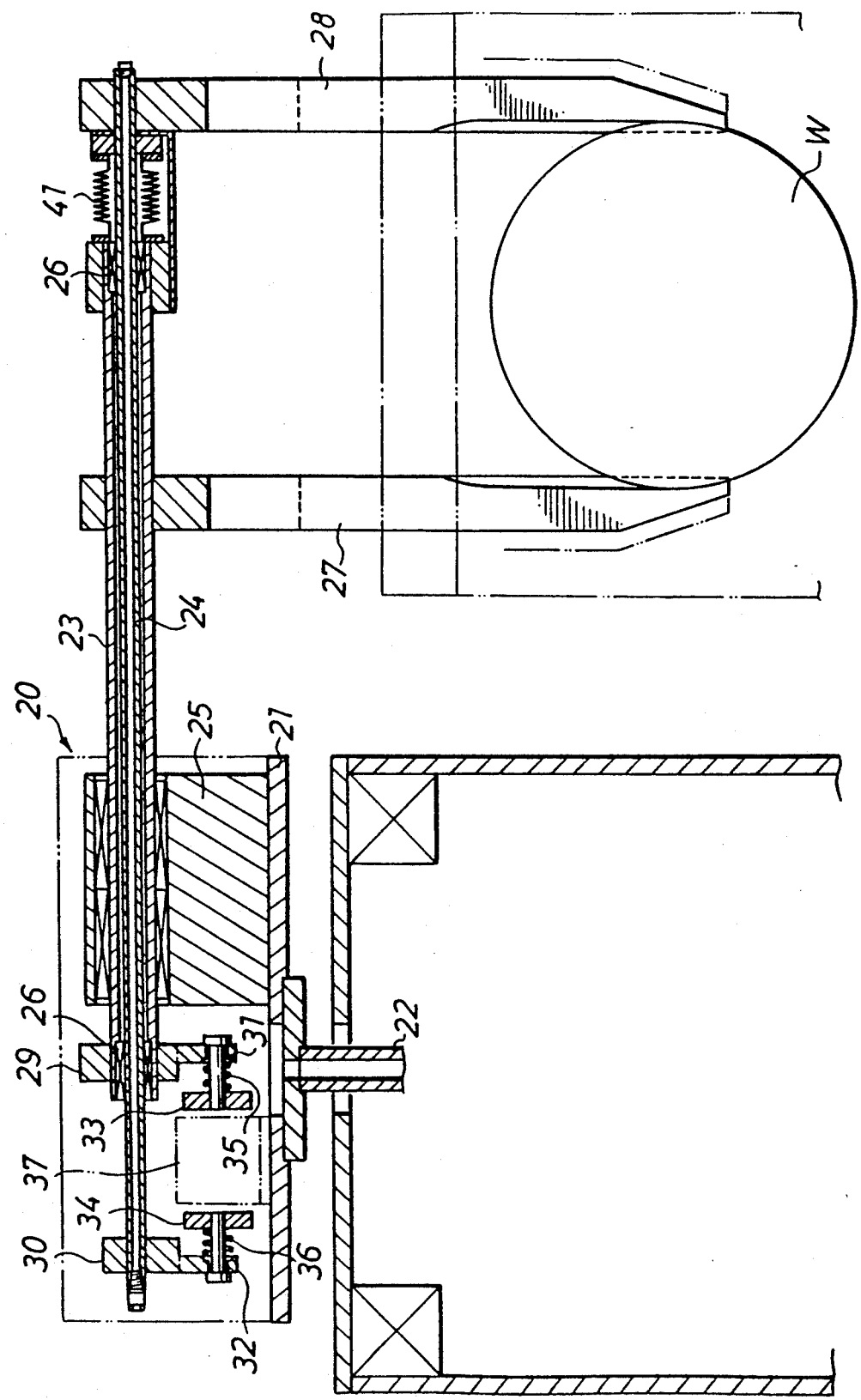
FIG. 8 is a sectional side view of the handling mechanism of the transportation robot.
Figure 9:
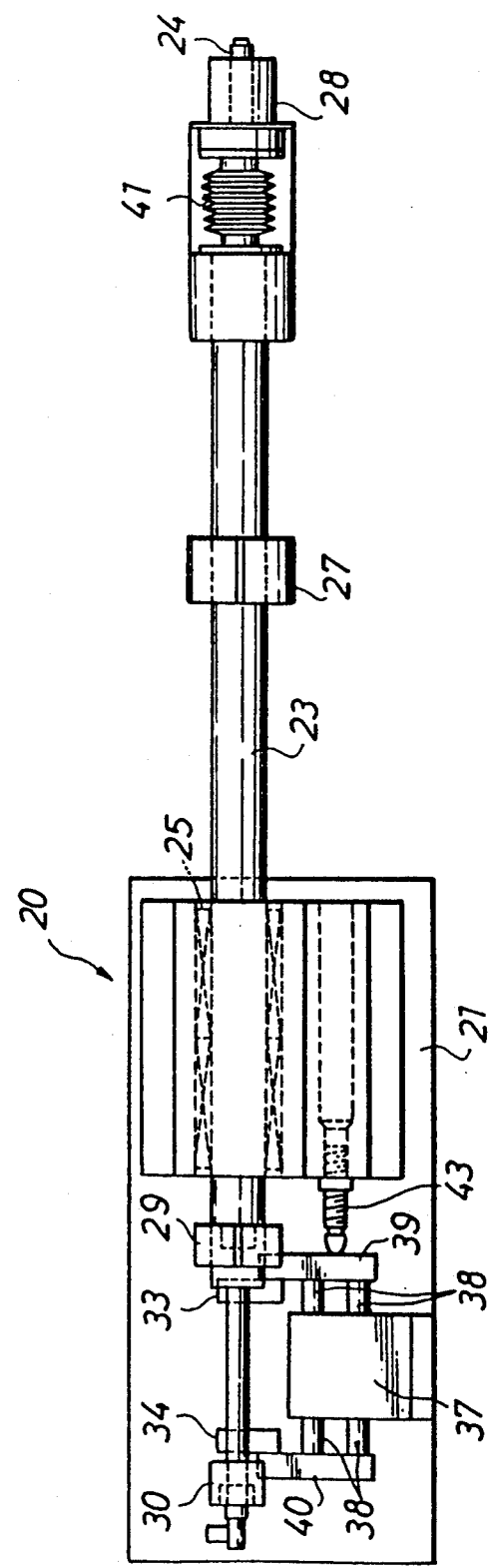
FIG. 9 is a top plan view of the handling mechanism of the transportation robot.

The wafer W, now erected by means of the wafer erection assembly 7, as described above, is held vertically and gripped by a transportation robot 20, shown in FIGS. 8 and 9, and is automatically transported from the wafer reception bath B to the preliminary cleaning bath C.

Now, the construction and operation of the transportation robot 20 will be described with reference to FIG. 8 and FIG. 9. Incidentally, FIG. 8 is a sectional side view of the transportation robot 20 and FIG. 9 is a top plan view of the same robot.

In these drawings, a reference numeral 21 designates a base mounted on the top face of a vertically shiftable shaft 22, and supported horizontally by this base 21 are hollow shafts 23, 24, which form a duplex tubular complex and are freely shiftable horizontally. In particular, the external hollow shaft 23 is supported by a shaft bearing unit 25 in a manner such that the shaft 23 can freely shift horizontally relative to the bearing unit 25 which is mounted on the base 21. The internal shaft 24, whose outer diameter is slightly smaller than the inner diameter of the tubular shaft 23, is passed inside the shaft 23 and is freely slidably supported by the bearing units 26, 26, which are provided at the ends of the shaft 23. A pair of vertical hold-between arms 27, 28 for holding a wafer W therebetween are respectively connected to the shaft 23 and shaft 24, the arm 27 near one end of the shaft 23 and the arm 28 at that end of the shaft 24 which is on the same side as said one end of the shaft 23. Connected at the other ends of the shafts 23 and 24 are respectively an arm 29 and an arm 30.

The lower part of the arm 29 is slidably penetrated by a horizontal shaft 31, and similarly the lower part of the arm 30 is slidably penetrated by a horizontal shaft 32, these shafts being collinear with each other and parallel to shafts 23, 24. Those ends of the shafts 31, 32 which face each other are respectively provided with flanges 33 and 34. A spring 35 is provided round the slidable shaft 31 and between the arm 29 and the flange 33, the spring 35 being compressed therebetween to function as a stress absorber. Similarly, a compressed spring 36 is provided round the slidable shaft 32 and between the arm 30 and the flange 34.

Also, as shown in FIG. 9, an actuator 37 is mounted on the base 21, and the four reciprocation rods 38 extend horizontally from the actuator 37, two to the left and two to the right, as seen in FIG. 9. A flange 39 is fixed at the ends of the right rods 38, and a flange 40 is fixed at the ends of the left rods 38. These flanges 39, 40 are connected to the flanges 33, 34, respectively.

Incidentally, a bellows tube 41 is provided between the right-side bearing unit 26 and the arm 28 so that that portion of the shaft 24 which lies between the right-side bearing unit 26 and the arm 28 is enclosed in the bellows tube 41, which expands and contracts without touching the shaft 24.

Thus, when the actuator 37 is operated to simultaneously withdraw the rods 38 each by the same amount, the shaft 23 moves leftward, as seen in FIG. 8, and the shaft 24 rightward by the same amount, so that the hold-between arms 27, 28 connected to these shafts move apart from each other, as shown in two-dot chain line in FIG. 8; on the other hand, when the rods 38 are pushed outward by the same amount, the shaft 23 moves rightward and the shaft 24 leftward by the same amount, whereby the hold-between arms 27, 28 close their distance to hold a wafer W vertically between them, as shown in solid line in FIG. 8. Incidentally, once the arms 27, 28 has thus touched the periphery of the wafer W, the shafts 23 and 24 will not move in the directions of closing the arms 27, 28, and thus the further outward movement of the rods 38 is absorbed by contraction of the springs 35, 36 so that the actuator 37 is prevented from accumulating further stress on the shafts 23, 24 to urge the arms 27, 28 to close their distance more; as the result, the wafer W is safe from receiving excessive force which may damage it. As a further safety means, a stopper 43 is provided to restrict the outward movement of the flange 39, as shown in FIG. 9, so that even if there is no wafer W between the arms 27, 28 to stop their closing moves, the arms 27, 28 automatically stop closing when the flange 39 is stopped by the stopper 43; thus the minimum distance between the arms 27, 28 is determined by adjusting the stopper 43.

The wafer W thus held by the transportation robot 20 is transported into the preliminary cleaning bath C, and steeped in the cleaning liquid contained in the preliminary cleaning bath C and as the result the wax adhering to the back face of the wafer W is removed. Incidentally, as shown in FIG. 4, the cleaning liquid is supplied from a purifier installation, not shown, to the preliminary cleaning bath C by way of a conduit 44.

The wafer W which has thus gotten rid of the wax in the preliminary cleaning bath C is then brought to the brush cleaning bath D, again by means of the transportation robot 20, and the both faces of the wafer W are simultaneously brushed in this brush cleaning bath D.

Figure 13:
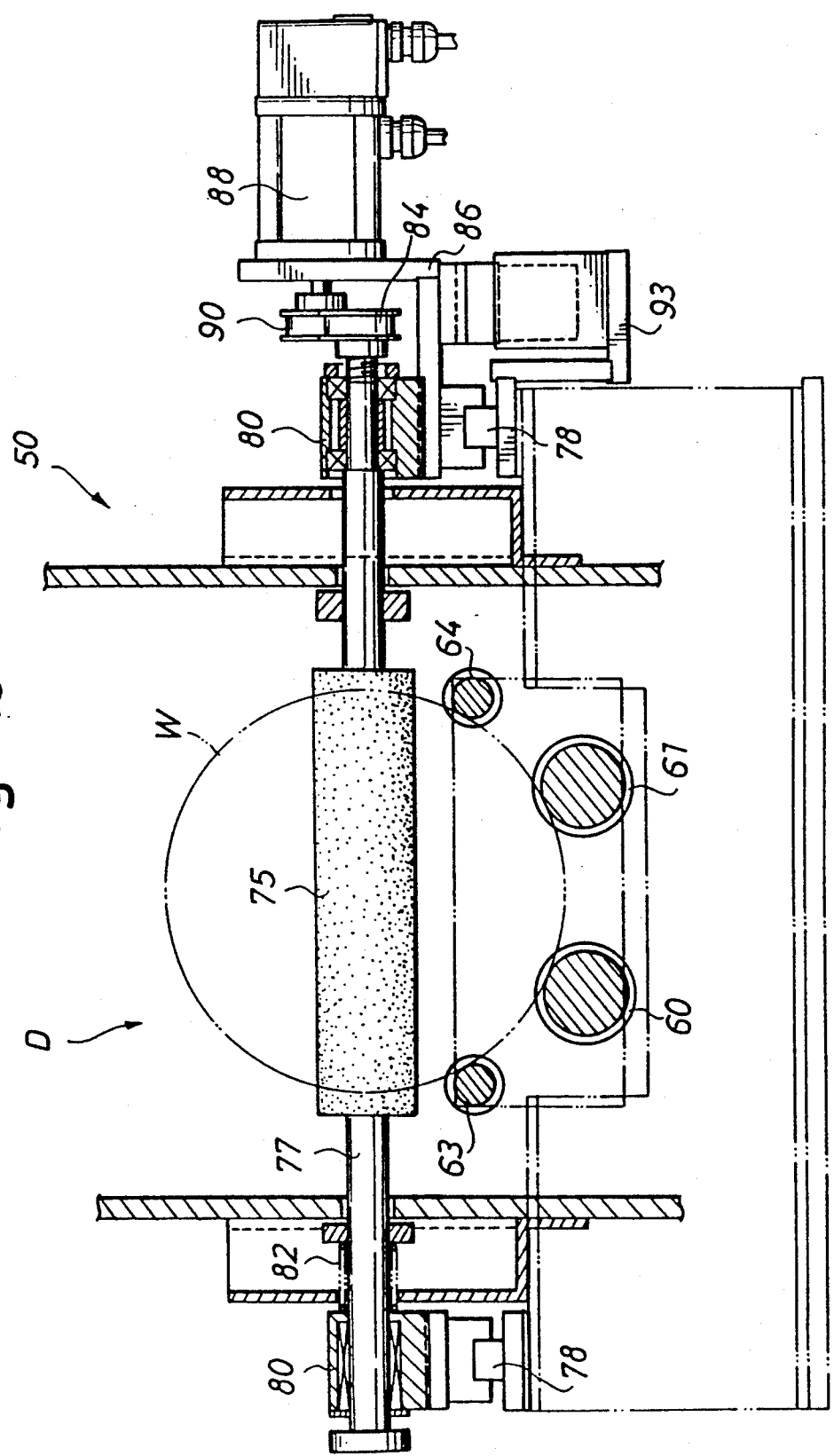
FIG. 13 is a sectional view taken on the line XIII—XIII of FIG. 12.
Figure 14:
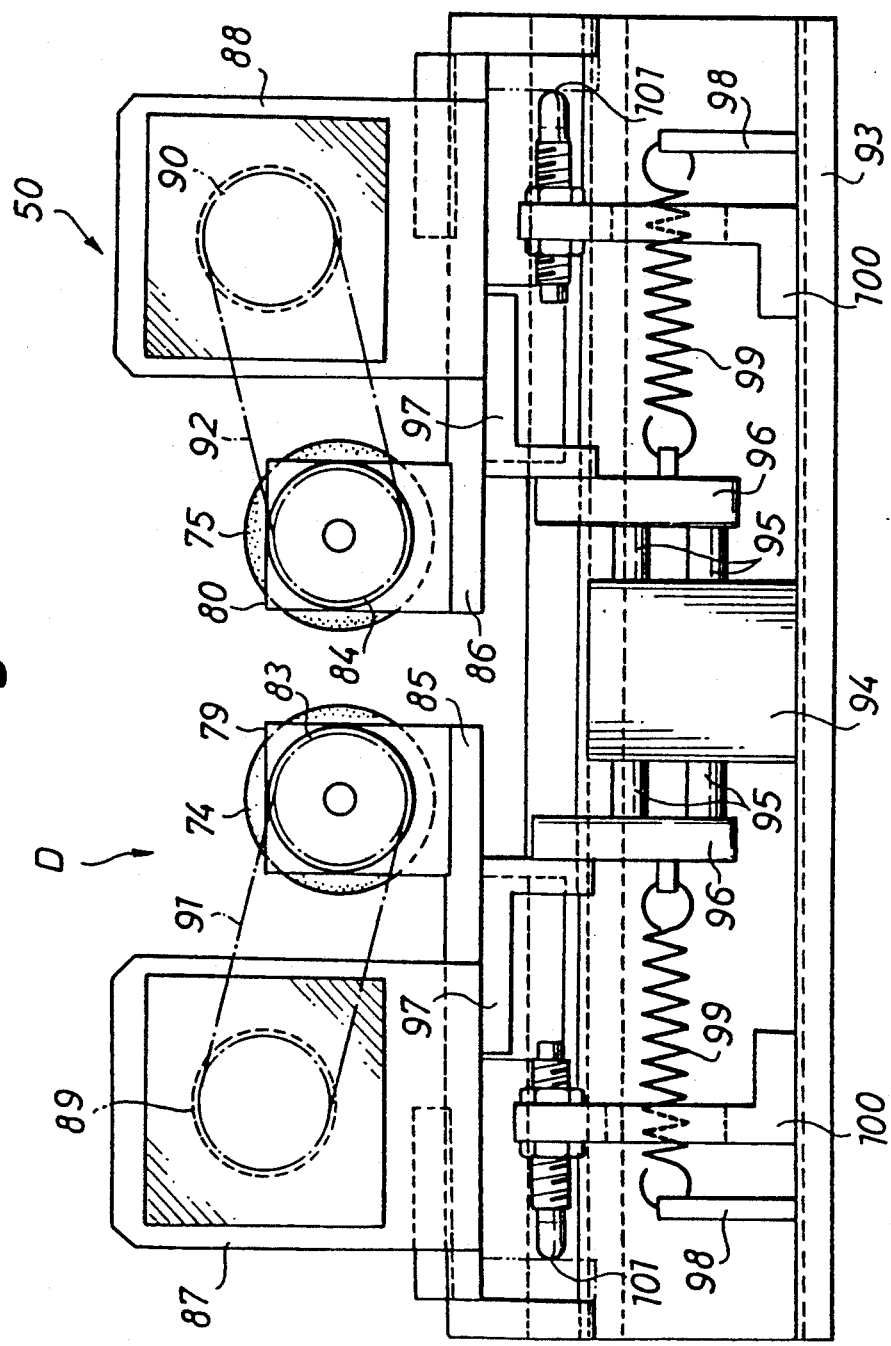
FIG. 14 is a view seen in the direction of the arrow f of FIG. 12.

Next, the construction of a brush cleaning apparatus 50 installed in the brush cleaning bath D will be described with reference to FIGS. 10 through 14. Incidentally, FIG. 10 is a fragmentary sectional side view of the brush cleaning apparatus 50, FIG. 11 is a view of the same apparatus 50 seen in the direction of the arrow d of FIG. 10, FIG. 12 is a partially sectional top plan view of the same apparatus 50, FIG. 13 is a sectional view taken on the line XIII—XIII of FIG. 12, and FIG. 14 is a view of the same apparatus 50 seen in the direction of the arrow f of FIG. 12.

Figure 10:
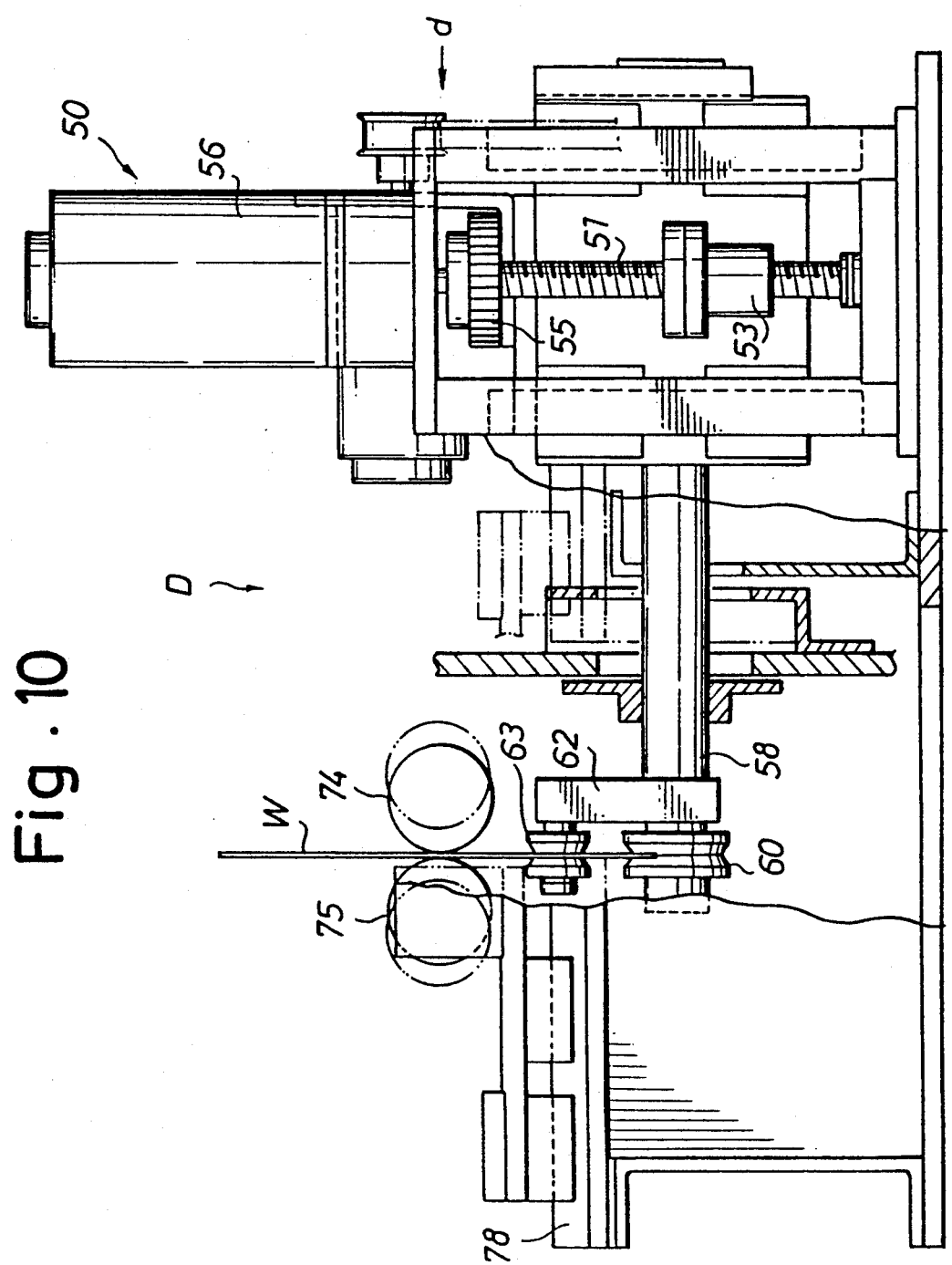
FIG. 10 is a fragmentary sectional side view of the brush cleaning apparatus.
Figure 11:
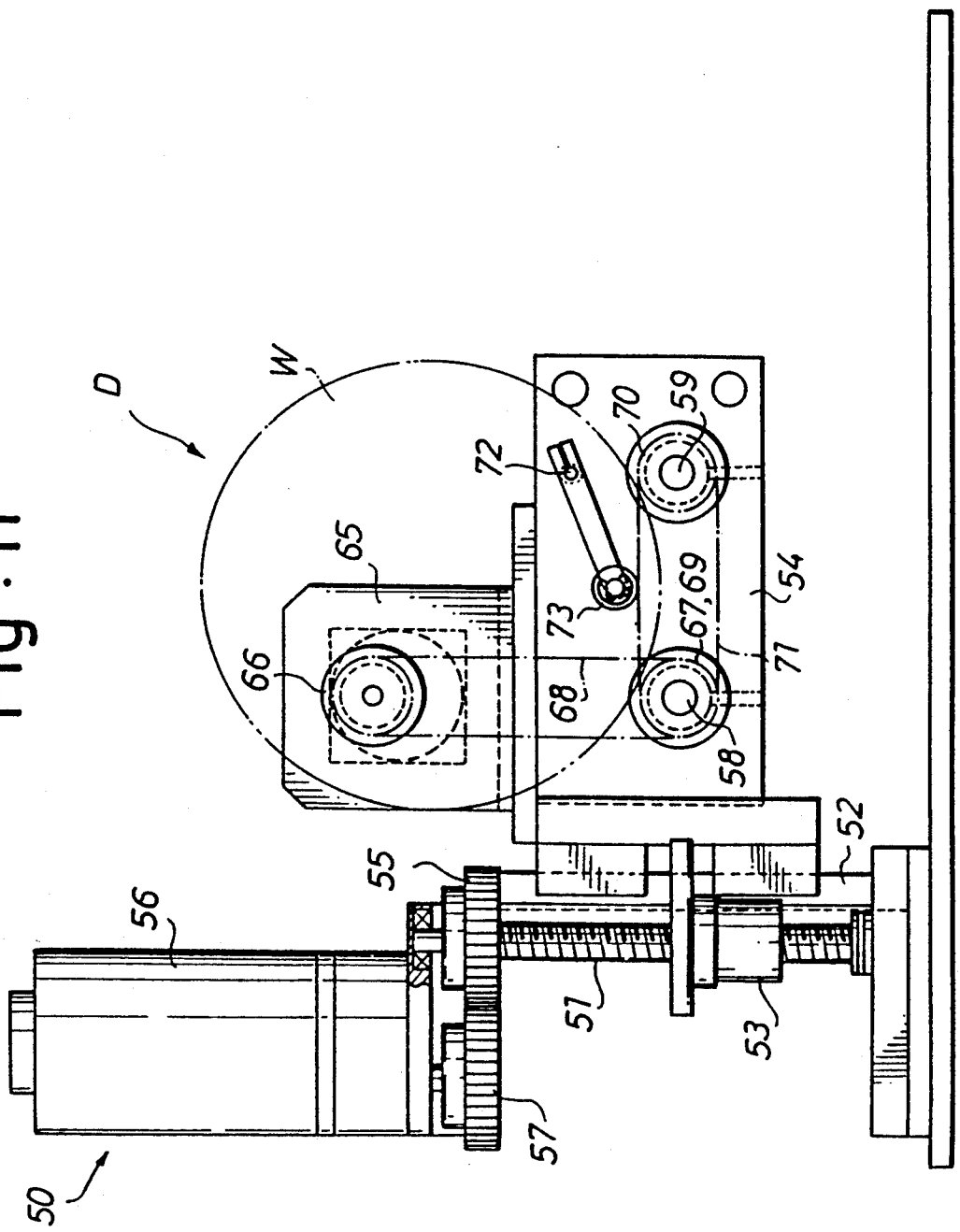
FIG. 11 is a view of the same brush cleaning apparatus seen in the direction of the arrow d of FIG. 10.

In FIGS. 10 and 11, a reference numeral 51 designates a ball screw which is supported vertically and freely rotatory, and a slider 53 is threadably mounted on the ball screw 51 in a manner such that the slider 53 ascends or descends along the ball screw 51 guided by guides 52, 52. A base body 54 is supported by this slider 53. A gear 55 is locked about the upper end of the ball screw 51, and the gear 55 is meshed with a gear 57 which is locked about the free end of the output shaft of a drive motor 56.

Figure 12:
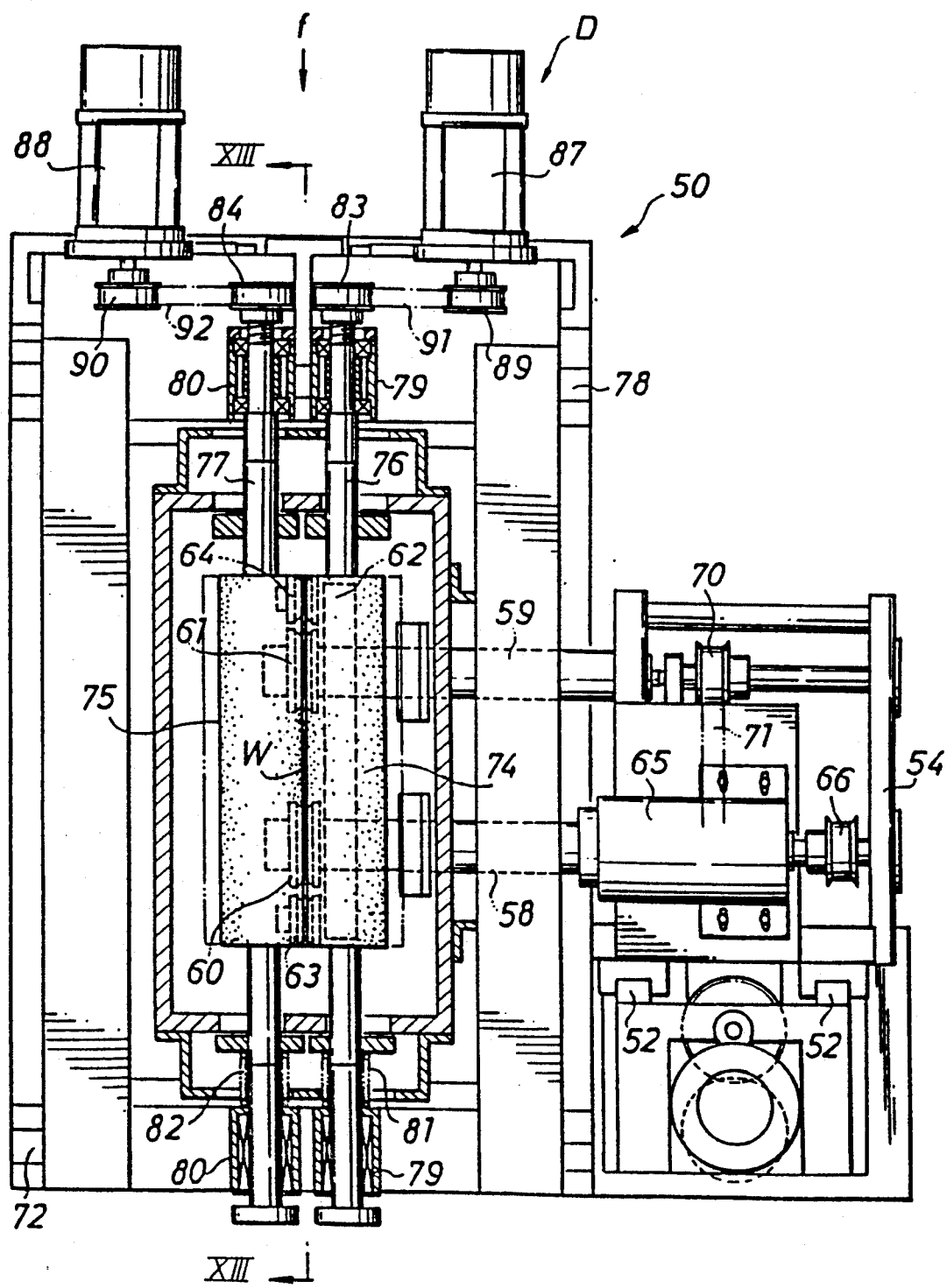
FIG. 12 is a partially sectional top plan view of the same brush cleaning apparatus.

As shown in FIG. 12, two horizontal rotatory shafts 58, 59 are supported by the base body 54 in a manner such that the shafts 58, 59 are freely rotatory; about the fore ends of the rotatory shafts 58, 59 are locked drive rollers 60, 61, respectively. A vertical plate 62 is borne by the fore portions of the rotatory shafts 58, 59, and two guide rollers 63, 64 are supported by the plate 62 in a manner such that the guide rollers 63, 64 are freely rotatory. As shown in FIG. 13, the guide rollers 63, 64 and the drive rollers 60, 61 are arranged in an arcuate row such that these rollers circumscribe a circle having a diameter equivalent to that of the wafer W.

A drive motor 65 is mounted on the base body 54, and, as shown in FIG. 11, a belt 68 is passed around a pulley 66 locked about the free end of the output shaft of the drive motor 65 and around a pulley 67 locked about the rotatory shaft 58. Also, another pulley 69 is locked about a middle portion of the rotatory shaft 58, and a belt 71 is passed around the pulley 69 and a pulley 70 locked about the rotatory shaft 59. Incidentally, as shown in FIG. 11, a tension pulley 73 which turns about a shaft 72 is adapted to impart a predetermined tension to the belt 71.

As shown in FIG. 12, two cylindrical rotatory brushes 74, 75 are arranged in a manner such that they are freely rotatable about their central axes which are horizontal and perpendicular to the rotatory shafts 58, 59 when projected on the sheet of FIG. 12. These rotatory brushes 74, 75 are supported by respective rotatory shafts 76, 77, which are borne by bearing units 79, 79, 80, 80, in a manner such that the shafts 76, 77 are freely rotatable, and these bearing units 79, 79, 80, 80 are capable of shifting freely along parallel guide rails 78, 78. Therefore, the rotatory brushes 74, 75 are adapted to shift in the axial directions of the rotatory shafts 58, 59, that is, the brushes 74, 75 can sideways approach and detach from each other. Incidentally, the rotatory shafts 76, 77 are always pressed in one axial direction by means of compressed springs 81, 82 each provided around respective one end portions of the shafts 76, 77, and the other ends of the shafts 76, 77 are provided with pulleys 83, 84, respectively.

Drive motors 87 88 are mounted on base members 85, 86, respectively, which support those bearing units 79, 80, respectively, which are on the side toward which the shafts 76, 77 are pressed, and the free ends of the output shafts of these drive motors 87, 88 are provided with pulleys 89, 90, respectively. A belt 91 is passed around the pulley 89 and the pulley 83, and a belt 92 is passed around the pulley 90 and the pulley 84.

Further, as shown in FIG. 14, an actuator 94 is mounted on a stationary base 93, and the base members 85, 86 are respectively connected to rods 95 via joints 96, 96, 97, 97. Incidentally, the bases 85 and 86 are always pulled away from each other by means of expanded springs 99, 99 which are each hooked between respective joints 96, 96 and respective retainers 98, 98 standing on the stationary base 93. Also, stopper support members 100, 100 stand on the stationary base 93, and stoppers 101, 101 for regulating the displacement amounts of the base members 85, 86, threadably penetrate through these support members 100, 100, respectively, in a manner such that the stoppers 101, 101 can be shifted axially for adjustment.

Thus, as shown in FIG. 4, the cleaning liquid and the pure water heated to a predetermined temperature (e.g., 40° C.) in the heater bath 102 are supplied to the brush cleaning bath D, where both faces of the wafer W are brushed simultaneously by means of the brush cleaning apparatus 50, shown in FIGS. 10-14, and the particles are removed from the wafer W. Incidentally, the heater bath 102 is supplied with the cleaning liquids and the pure water via conduits 103, 104 and 105, separately, and the brush cleaning bath D is supplied with the cleaning liquids and the pure water via conduits 106 and 107, respectively. The used cleaning liquid and pure water are drained from the brush cleaning bath D via a conduit 108.

Next, the operation of the brush cleaning apparatus 50 will be described with reference to FIGS. 10 through 14.

Before a wafer W is set in the brush cleaning apparatus 50, the rods 95 of the actuator 94, shown in FIG. 14, are pulled out due to the pulling forces of the springs 99, 99, and, therefore, the rotatory brushes 74, 75 are held apart from each other, as drawn in one-dot chain line in FIG. 10, so that a predetermined amount of clearance is formed between the two brushes.

The wafer W held by the transportation robot 20 (ref. FIG. 8) is inserted vertically between the rotatory brushes 74, 75, and the lower periphery rests on the drive rollers 60, 61 and guide rollers 63, 64.

Thereafter, the actuator 94 is driven in a manner such that the rods 95 are withdrawn, and this causes the rotatory brushes 74, 75 to approach each other and press the wafer between them.

If the drive motor 65 is driven at this moment (ref. FIG. 11), the rotational torque is transmitted to the rotatory shaft 58 via the pulley 66, the belt 68, and the pulley 67, and also to the rotatory shaft 59 by virtue of the pulley 69, the belt 71 and the pulley 70; as the result, the rotatory shafts 58, 59 turn in the same direction and the wafer W resting on them starts turning circumferentially at a predetermined rate. Incidentally, it is at this time that the cleaning liquid is applied to the wafer W.

Also, with reference to FIG. 12, if the drive motors 87, 88 are driven, the rotational torque of the motor 87 is transmitted to the rotatory shaft 76 via the pulley 89, the belt 91, and the pulley 83, and similarly the rotational torque of the motor 88 is transmitted to the rotatory shaft 77 via the pulley 90, the belt 92, and the pulley 84, whereupon these rotatory shafts 76, 75 together with the respective rotatory brushes 74, 75 start turning in the opposite directions (in such directions that the wafer W is pressed onto the drive rollers 60, 61 and the guide rollers 63, 64), and thus both faces of the wafer W are cleaned with the brushes 74, 75 and the particles are removed. During this brushing, the drive motor 56 (ref. FIG. 11) is operated in a manner such that the direction of its rotation is alternated periodically, and such rotation is transmitted to the ball screw 51 via the gears 57, 55, and as the ball screw 51 repeats turning in one direction for a period of time and then in the opposite direction for the same period of time, the slider 53 threadably ridden on the ball screw 51 climbs up and down together with the base member 54; as the result, the drive rollers 60, 61 and the guide rollers 63, 64 as well as the wafer W resting on these rollers are brought up and down altogether, and the wafer faces are cleaned uniformly all over including the center portions, so that the particles sticking to the wafer W are all brushed off the wafer's surface.

The wafer W thus brushed is then held by the transportation robot 20, and transported into the next bath, which is the cleaning bath E, where it is rinsed.

Figure 16:
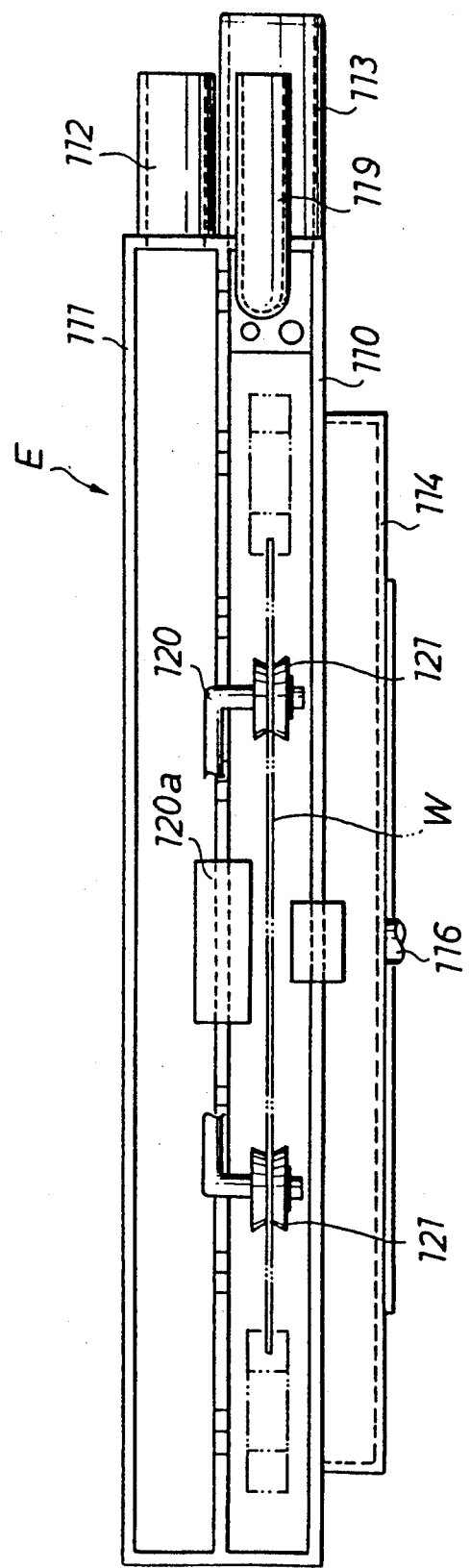
FIG. 16 is a top plan view of the same cleaning bath of FIG. 15.
Figure 17:
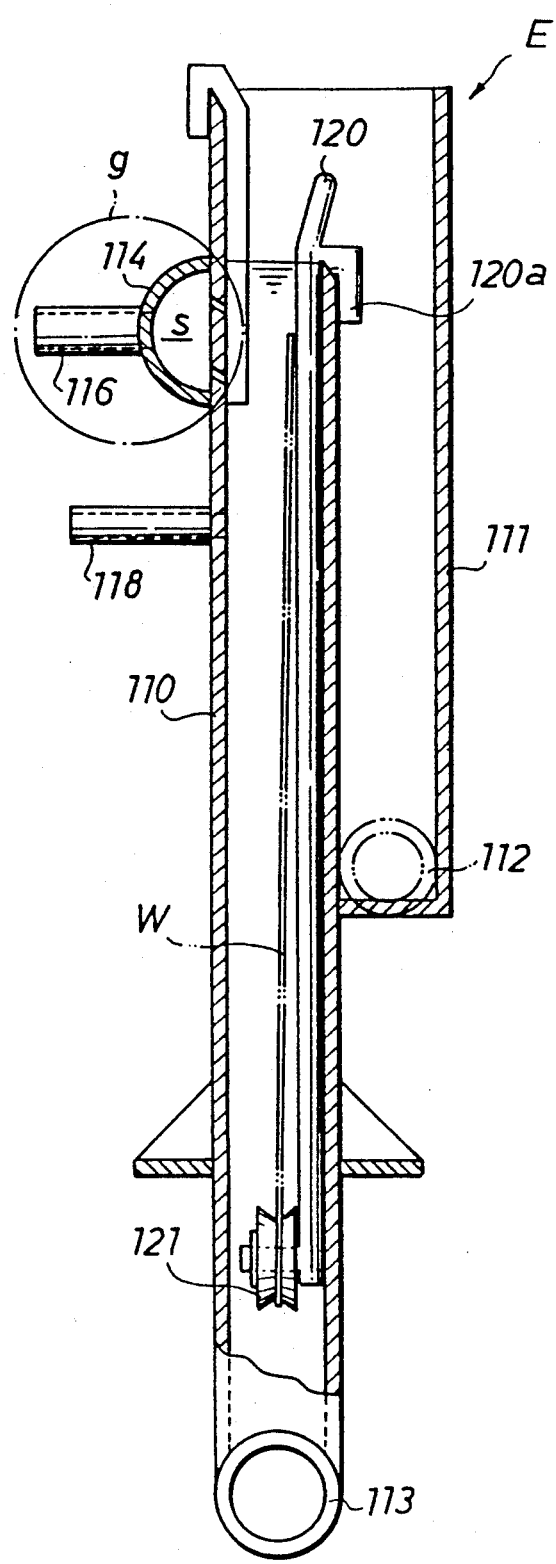
FIG. 17 is a partially cross-sectional side view of the same cleaning bath of FIG. 15.
Figure 18:
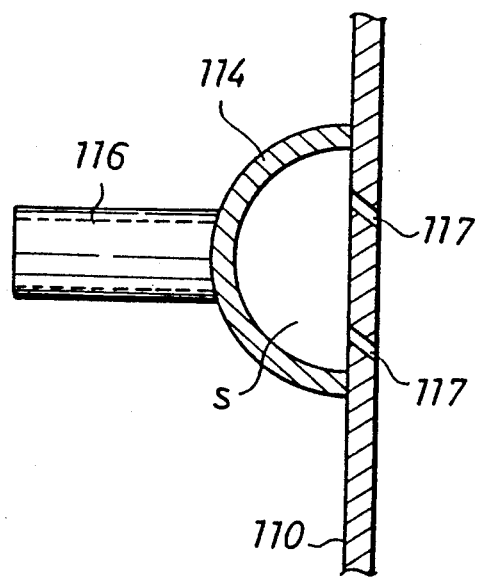
FIG. 18 is a enlarged detail of the portion g of FIG. 17.

Next, the construction of the cleaning bath E will be described with reference to FIGS. 15 through 19. Incidentally, FIG. 15 is a partially broken-away front view of the cleaning bath E, FIG. 16 is a top plan view of the same bath, FIG. 17 is a partially cross-sectional side view of the same bath, FIG. 18 is a enlarged detail of the portion g of FIG. 17, and FIG. 19 is a view of the same bath seen in the direction of arrow h of FIG. 15.

The cleaning bath E is essentially made of a vertical thin tank 110, and an overflow tank 111 is formed adjacent to a one of the big walls of the bath E, and an overflow pipe 112 is connected to the bottom of the overflow tank 111. Incidentally, the overflow pipe 112 is connected at its other end to a drain conduit 132 shown in FIG. 4.

Figure 15:
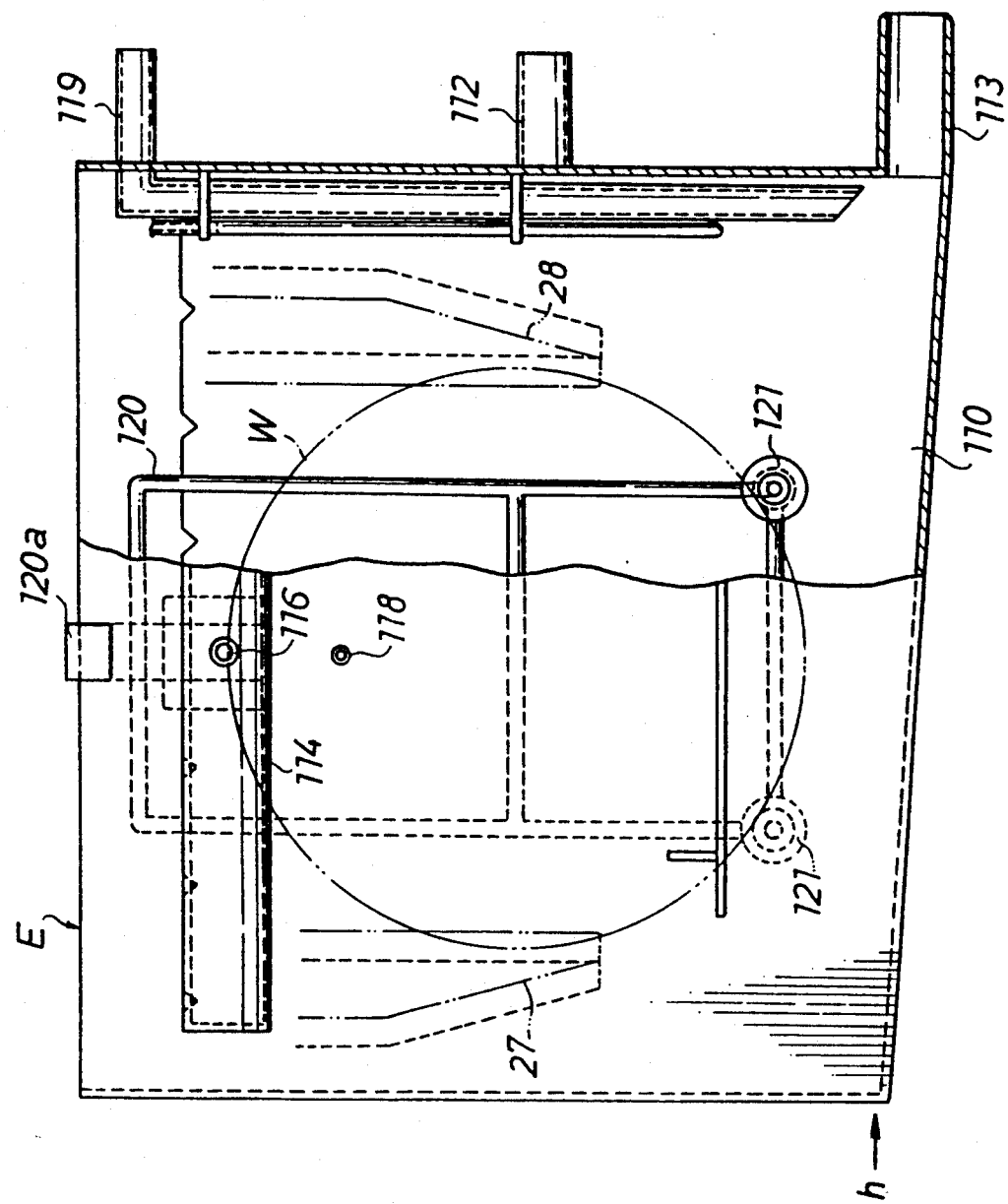
FIG. 15 is a partially broken-away front view of a cleaning bath.
Figure 19:
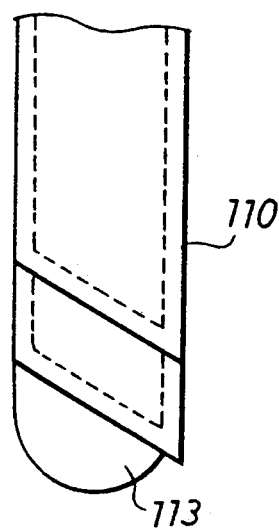
FIG. 19 is a view of the same cleaning bath seen in the direction of arrow h of FIG. 15.

A drain pipe 113 is connected to the bottom of the tank 110, and as shown in FIG. 15 and FIG. 19, the bottom face of the tank 110 is sloped lengthwise toward the drain pipe 113, and also sloped widthwise toward one sideline. Therefore, the contaminants and impurities that fall on the bottom of the tank 110 slide toward said one sideline and eventually toward the drain pipe 113 along the sideline, and as the result, all of the contaminants, etc. are drained from the tank 110 by way of the drain pipe 113, and no contaminants, etc. remain in the bottom of the tank 110.

In the vicinity of the top of the tank 110, a chamber S (FIG. 17) defined by a cover member 114, is formed, and a supply pipe 116 of a supply conduit 115 is connected to the chamber S, as shown in FIG. 4. As shown in FIG. 18 in detail, the chamber S communicates with the tank 110 via a plurality of injection nozzles 117 which are made through that wall of the tank 110 on which the chamber S is formed. The injection nozzles 117 are sloped downwardly toward the tank 110.

Below the supply pipe 116 for the tank 110 is provided a supply pipe 118, which is also connected to the supply conduit 115 (ref. FIG. 4), Incidentally, in FIG. 15, a reference numeral 119 designates a pipe for supplying a cleaning fluid.

In the tank 110 is provided a rectangular holding frame 120 for supporting the wafer W in a manner such that the wafer W is slightly titled from the vertical position. This rectangular holding frame 120 has a pair of rollers 121, 121 at the lower corners which are pivoted on the respective axes so as to freely rotate on them; the peripheries of the rollers 121, 121 are V-letter shaped in profile, and thus receive the peripheral edge of the wafer W. As shown in FIG. 17, the holding frame 120 is hung vertically in the tank 110, since a hook 120a formed at the upper part of the frame 120 is hooked on the upper edge of that wall of the tank 110 which is not formed with the injection nozzles 117.

Incidentally, as shown in FIG. 4, the entire body of the cleaning bath E is steeped in the pure water contained in a tank 122, and an ultrasonic wave generator 123 is installed in the lower part of the tank 122.

Thus, the wafer W held by the transportation robot 20 (ref. FIG. 8 and FIG. 9) is steeped in the pure water of the tank 110 with the wafer periphery resting on the rollers 121, 121 of the holding frame 120, as shown in FIG. 15; the robot 20 releases the wafer W and the upper part of the wafer W receives the water stream which is ejected into the tank 110 from the injection nozzles 117 (ref. FIG. 18), and as the result, the wafer W is forced to abut against the frame 120 as it slants a little from the vertical position and held in such position stably. Furthermore, since the injection nozzles 117 are sloped downwardly toward the tank 110 (i.e., toward the wafer W) the wafer W receives a downward force and is therefore pressed on the rollers 121, 121; as the result, the wafer W is prevented from floating in the pure water and is forced to assume the position shown in FIG. 17. Incidentally, the pure water is supplied to the tank 110 mainly by way of the supply pipe 118 and also by the injection nozzles 117, and the pure water that has overflown into the overflow tank 111 from the tank 110 is sent to the drain conduit by way of the overflow pipe 112.

With the things arranged as described, the entire body of the cleaning bath E is subjected to the ultrasonic waves generated by the ultrasonic wave generator 123, and the wafer W supported by the frame 120 in the cleaning bath E is rinsed with the pure water.

Next, the cleaning bath F will be described. The construction of the cleaning bath F is identical to that of the cleaning bath E, and, as shown in FIG. 4, a tank 124 is installed below the cleaning bath F.

Two different kinds of cleaning liquid are supplied to the tank 124 by way of the conduits 125 and 126, respectively, and their mixture is pressurized by means of the pump 127, heated to a predetermined temperature (e.g., about 80° C.) by a conduit heater 128, and then passed through a filter 129 to enter the cleaning bath F.

The wafer W which has been rinsed in the cleaning bath E is again held by the transportation robot arm 20, and removed from the cleaning bath E, and then it is transported to the cleaning bath F, where the wafer W is steeped in the cleaning liquid mixture contained in the cleaning bath F, in the same manner as shown in FIG. 15, and the particles adhering to the wafer's surface are removed.

Incidentally, the wafer W which has been freed of particles in the cleaning bath F is of a high temperature (e.g., about 80° C.), and if this wafer is raised out of the liquid as it is, the wafer's surface promptly dries with unfavorable results; therefore, the hot cleaning liquid mixture in the cleaning bath F is returned to the tank 124 by way of a conduit 130, shown in FIG. 4, and simultaneously as this, pure water is supplied to the cleaning bath F by way of a pure water conduit 115, with which the wafer W is promptly cooled and, at the same time, rinsed. Then, the pure water having been used to cool the wafer W is sent to the drain conduit 132 by way of a conduit 131.

Now, the constructions of the cleaning baths G, H, and I are the same as those of the cleaning baths E and F, and the wafer W which has been cleaned in the cleaning bath F is carried by the transportation robot 20 to visit the cleaning baths G, H, and I in sequence, treated with pure water at the cleaning baths G and I and with a cleaning liquid at the cleaning bath H; as the result, the ionic impurities sticking to the wafer's surface are removed.

The wafer W thus cleaned and treated variously in the baths C through I, is then carried by the transportation robot 20 to the dryer bath L, where it is quickly dried.

Figure 20:
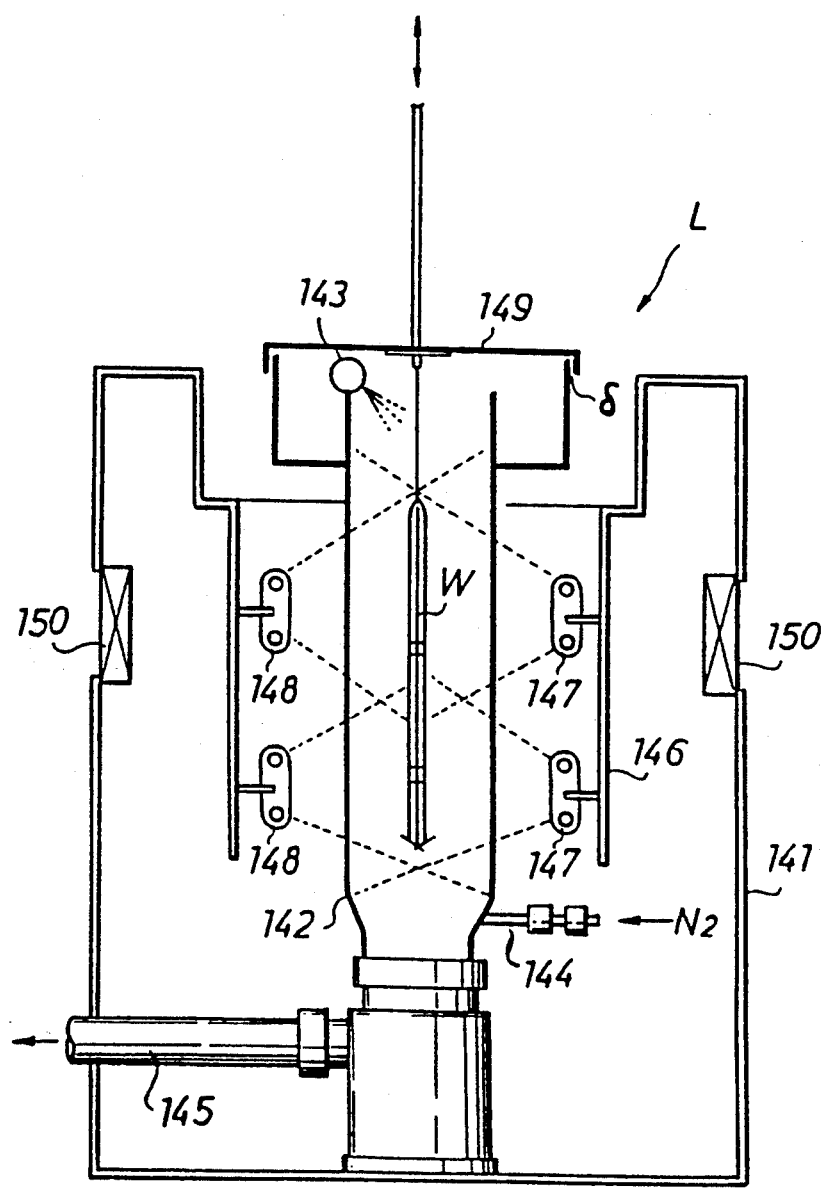
FIG. 20 is a cross section of the dryer bath.

Now, the construction of the dryer bath L will be described in detail with reference to FIG. 20.

The dryer bath L comprises a highly heat insulating casing 141 made of stainless steel, and a quartz glass beaker 142 is installed to stand in the center of the casing 141. The beaker 142 opens upward, and at the upper brim is provided a shower unit 143 for raining pure water into the beaker 142, and to the bottom portion of the beaker 142 are connected an inert gas supply pipe 144 and a pure water drain pipe 145.

The beaker 142 is encircled by a tubular shield 146; to the inner wall of the shield 146 are attached two short-wave radiators 147, 147, one over the other, each consisting of a short-wave infrared ray lamp, and similarly a pair of medium-wave radiators 148, 148 each consisting of a medium-wave infrared ray lamp are attached to the inner wall of the shield 146 at a location diagonally opposed to the short-wave radiators 147, 147.

The top opening of the beaker 142 is closed by a lid member 149, and two cooling fans 150, 150 are provided at the upper portion of the casing 141.

Figure 21:
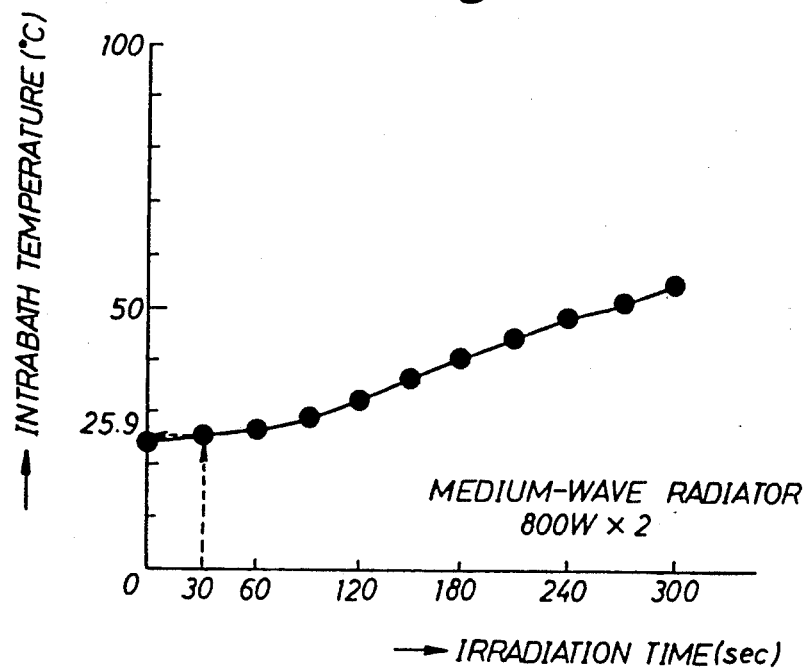
FIG. 21 is a graph showing a relationship between the irradiation time and the intrabath temperature when the two medium-wave radiators are used to generate medium-wave infrared ray.

Thus, the interior of the beaker 142 is cleaned with the pure water poured by the shower unit 143, and the pure water thus used is drained from the casing 141 by way of the pure water drain pipe 145. Thereafter, the medium-wave radiators 148, 148, and the cooling fans 150, 150 are switched on, whereupon the beaker 142 is first heated by the medium-wave radiators 148, 148. Incidentally, FIG. 21 shows a relationship between the irradiation time and the intrabath temperature when the two medium-wave radiators 148, 148 of 800 W are used to generate medium-wave infrared ray.

Figure 22:
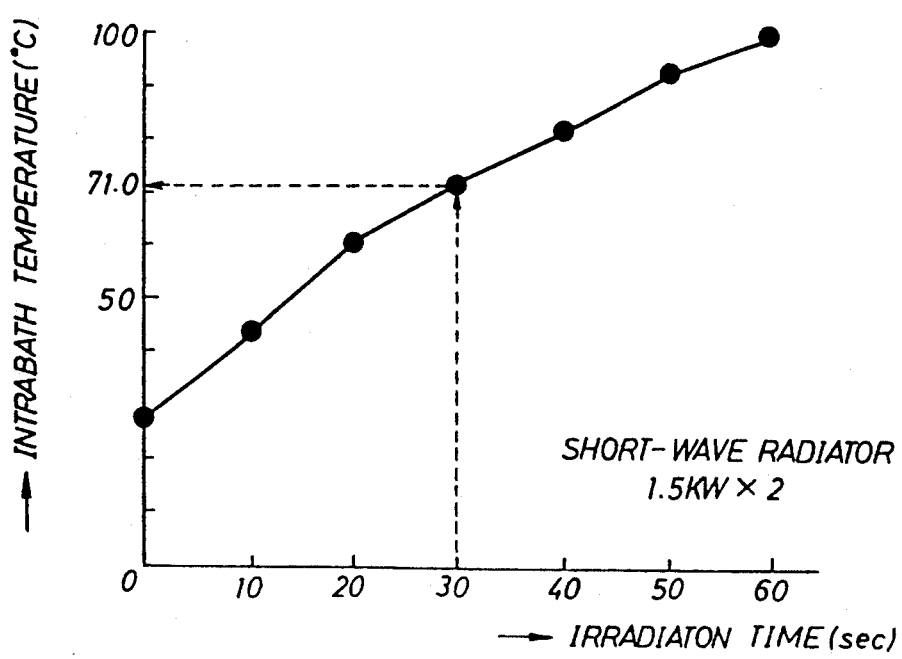
FIG. 22 is a graph showing a relationship between the irradiation time and the intrabath temperature when the two short-wave radiators are used to generate short-wave infrared ray.

Next, when a wafer W is set in the beaker 142 with its mirror face faced with the short-wave radiators 147, 147, these radiators 147, 147 are switched on and an inert gas (e.g., nitrogen, argon) is blown into the beaker 142 through an inert gas supply pipe 144 and it is sealed therein; thus, the mirror face (polished face) of the wafer W in the inert gas atmosphere is subjected to the irradiation of the short-wave infrared ray, and thereby forced to dry quickly. FIG. 22 shows a relationship between the irradiation time and the intrabath temperature when the two short-wave radiators 147, 147 of 1.5 KW are used to generate short-wave infrared ray; it is seen from the graph that if the short-wave radiators 147, 147 emit the short-wave infrared ray for thirty seconds, the temperature inside the dryer bath L rises promptly to about 70° C., while if the medium-wave radiators 148, 148 emit the medium-wave infrared ray for the same length of time (30 seconds), the temperature inside the dryer bath L rises only to about 25° C. (ref. FIG.

21). Incidentally, simultaneously as the short-wave radiators 147, 147 and the medium-wave radiators 148, 148 are switched on, the cooling fans 150, 150 are started so that these short-wave radiators 147, 147 and the medium-wave radiators 148, 148 are cooled.

Now, the wafer W dried by the infrared ray is taken away from the dryer bath L by means of the transportation robot 20, and stored one by one in wafer cassettes 115 (ref. FIG. 4) which are set in the unloader assembly M. Thus, an automatic continuous one-by-one wafer cleaning operation is completed. As described so far, the automatic cleaning apparatus of the present invention operates in a wafer-by-wafer manner wherein the wafers W are held and transported by the transportation robot 20 one after another and are treated continuously, that is, the wafers are not grouped and stocked in a carrier such as a wafer cleaner basket for a batch manner cleaning operation; as the result, the conventional carriers are not needed in the present system, and the so-called "carrier-less" operation is realized, and thus the problem of wafer contamination ascribable to the carriers has been solved, and the wafers W will be cleaner and of higher quality. Also, even when the wafers W to be cleaned have a relatively large diameter and thus are heavy, since the wafers W are handled automatically by the transportation robot 20 one by one, the human operator is spared of the painstaking work and, therefore, much human labor is saved.

RESULTS OF THE INVENTION

As is clear from the above description, according to the invention, the automatic wafer cleaning apparatus is constructed to comprise: a loader assembly for receiving in the liquid the wafers to be cleaned one by one; a brush cleaning bath for holding a wafer received between a pair of turning brushes to thereby clean both faces of the wafer W at once; a plurality of cleaning baths containing respective cleaning liquids or pure water; a dryer bath for drying cleaned wafers; an unloader assembly for storing the dried wafers in it; and a transportation means for holding and transporting the wafers one by one; so that now the conventional carriers are useless in the present apparatus (realization of the carrier-less operation), and it has become possible to save human labor, and increase the wafer quality.

Obviously many modifications and variations of the present invention are possible in the light of the above teachings. It is therefore to be understood that within the scope of the appended claims the invention may be practiced otherwise than is specifically described.

What is claimed is:

1. An automatic single wafer transfer wafer cleaning apparatus comprising:
   a loader assembly means for receiving, in a liquid, wafers to be cleaned one wafer at a time, each wafer assuming a horizontal orientation, and wherein each wafer is brought to said liquid, said loader assembly means by flow of said liquid, said loader assembly means including means for erecting each wafer to a vertical orientation;
   a brush cleaning bath means for cleaning a wafer between a pair of cylindrical rotatory brushes included therein to thereby clean both faces of a wafer at once;
   a plurality of wafer cleaning bath means containing respective cleaning liquids including means for receiving and cleaning said wafers one at a time while supporting said wafers in a substantially vertical orientation;
   a dryer bath means for drying cleaned wafers;
   an unloader assembly means for storing the dried wafers in it; and
   a transportation means including means for vertically holding wafers for transportation of the wafers one at a time.

2. The automatic wafer cleaning apparatus as claimed in claim 1 wherein said means for erecting each wafer includes a wafer erection means for receiving a wafer carried horizontally thereto and for erecting the wafer vertically, said wafer erection means comprising a suction arm having a means for applying suction to a wafer, a wafer positioning means, and a drive means for swinging said suction arm about a horizontal shaft.

3. The automatic wafer cleaning apparatus as claimed in claim 2 wherein said means for applying suction to a wafer comprises a suction nozzle connected to a vacuum source via a vacuum suction conduit, said suction nozzle having a brim defining a plane such that any flat surface fits squarely on said brim of said suction nozzle.

4. The automatic wafer cleaning apparatus as claimed in claim 2 wherein said wafer positioning means comprises a wafer receiving plate and stopper pins provided to extend vertically from said wafer receiving plate in an arcuate row such that these pins circumscribe a circle having a diameter approximating a diameter of a wafer.

5. The automatic wafer cleaning apparatus a claimed in claim 2 wherein said drive means comprises a servomotor and a set of gears which transmit rotational torque generated by said servomotor to said horizontal shaft of said suction arm.

6. The automatic wafer cleaning apparatus as claimed in claim 1 wherein said brush cleaning bath means includes a brush cleaning assembly means including
   means for holding a wafer vertically between said brushes, and
   means for brushing both faces of a vertically held wafer at once, and including
   said pair of cylindrical rotatory brushes, wherein said brushes are horizontal and parallel,
   a brush drive means for driving said rotatory brushes to rotate, and
   a wafer drive means for supporting and driving a wafer to turn circumferentially.

7. The automatic wafer cleaning apparatus as claimed in claim 6 wherein said brush cleaning assembly means further comprises
   a brush shift means for shifting said parallel pair of rotatory brushes sideways, to change a distance between said rotatory brushes.

8. The automatic wafer cleaning apparatus as claimed in claim 6 wherein said wafer drive means comprises
   drive rollers having seat means for receiving an edge of a wafer, and
   a drive motor for driving said drive rollers to turn.

9. The automatic wafer cleaning apparatus as claimed in claim 8 wherein said brush cleaning assembly means further comprises
   means for vertically shifting said wafer drive means and a wafer supported thereby relative to said brushes, and wherein
   said wafer drive means includes means for periodically shifting a wafer vertically, relative to said brushes, with said means for vertically shifting a wafer.

10. The automatic wafer cleaning apparatus as claimed in claim 9 wherein said means for vertically shifting a wafer comprises
- a ball screw mechanism means for vertically shifting said wafer drive means including a screw rod, and
- a drive motor for turning said screw rod of said ball screw mechanism means, and
- means for periodically reversing a direction of rotation of said screw rod.

11. The automatic wafer cleaning apparatus as claimed in claim 6 wherein said rotatory brushes are mounted on separate shiftable bases, which bases are connected to an actuator mounted on a stationary base, said shiftable bases being pulled away from each other by means of springs, and stopper means including stopper support members fixed on the stationary base for regulating the displacement amounts of the base members, said stopper means being threadably inserted through respective stopper support members for axial adjustment.

12. The automatic wafer cleaning apparatus as claimed in claim 1 wherein said wafer cleaning bath means each comprise a vertical thin tank for containing a cleaning liquid, a wafer holder means for supporting a wafer nearly vertically in said thin tank, and injection nozzles for injecting a cleaning liquid toward an upper part of a wafer supported by said wafer holder means.

13. The automatic wafer cleaning apparatus as claimed in claim 12 wherein said tank is provided with an overflow tank wall means for maintaining the level of the cleaning liquid constant.

14. The automatic wafer cleaning apparatus as claimed in claim 12 further including a drain pipe connected to the bottom of the tank, and wherein a bottom face of the tank is sloped lengthwise toward the drain pipe and sloped widthwise toward one sideline of said vertical thin tank.

15. The automatic wafer cleaning apparatus as claimed in claim 12 wherein said wafer holder means is detachably hooked in the tank, and has a pair of rollers at a lower part thereof, said rollers being pivoted on respective axes so as to freely rotate, and wherein peripheries of said rollers are V-letter shaped in profile to provide seats for wafer edges, whereby a wafer is supported by said wafer holder means at said lower edge and the tank wall at an upper edge, and is slightly tilted from a vertical orientation.

16. The automatic wafer cleaning apparatus as claimed in claim 12 wherein said injection nozzles are at least one in number and are made through a tank wall and directed either horizontally or downwardly toward an upper part of a wafer in the tank whereby said nozzles apply the liquid onto the wafer to press a wafer against said wafer holder means to prevent a wafer from floating and to facilitate cleaning of a wafer.

17. The automatic wafer cleaning apparatus as claimed in claim 1 wherein said dryer bath means includes at least one medium-wave radiator having a medium-wave infrared ray lamp and at least one short-wave radiator having a short-wave infrared ray lamp.

18. The automatic wafer cleaning apparatus as claimed in claim 1 wherein said means for vertically holding wafers for transportation includes a wafer handling assembly, said wafer handling assembly comprising:
- a horizontal duplex tubular complex comprising an internal hollow shaft and an external hollow shaft, said external hollow shaft being supported to freely shift axially, said internal shaft being freely slidable in said external hollow shaft;
- a pair of vertical hold-between arms for holding a wafer therebetween, one said vertical hold-between arm being connected to said external hollow shaft near one end of said external hollow shaft and another of said vertical hold-between arms being connected to said internal shaft at that end of the internal shaft which is on the same side as said one end of said external hollow shaft;
- an actuator subassembly means connected to ends of said external hollow shaft and said internal hollow shaft which are opposite respective ones of said vertical hold-between arms, for driving said external hollow shaft and said internal hollow shaft in opposite axial directions by the same amount.

19. The automatic wafer cleaning apparatus as claimed in claim 12 wherein said actuator subassembly means further comprises:
- an actuator with reciprocating rods,
- an absorber means, and
- a pair of connector means connecting the actuator to ends of said external hollow shaft and said internal hollow shaft;
- said actuator, absorber means and connector means being interlocked to determine an amount and directions of axial shifting of said external hollow shaft and internal hollow shaft by the amount and directions of the axial shifting of said reciprocating rods of the actuator, unless the closing movement of the hold-between arms is resisted, in which case further movements of said reciprocating rods of said actuator are absorbed by said absorber means and the hold-between arms do not further close.

20. The automatic wafer cleaning apparatus as claimed in claim 19 wherein said actuator subassembly further includes a stopper means for stopping said reciprocating rods of said actuator from extending by more than a fixed amount thereby limiting the extent to which said hold-between arms can close.

21. The automatic wafer cleaning apparatus as claimed in claim 18 wherein said duplex tubular complex further comprises an expansible and contractible bellows tube provided between that end of the external hollow shaft which bears one of the hold-between arms and the other hold-between arm borne by the end of said internal hollow shaft, so that a portion of said internal hollow shaft extending beyond said external hollow shaft is enclosed in, but not touched by, said bellows tube.

* * * * *